United States Patent
Yamaguchi et al.

(10) Patent No.: US 6,289,059 B1
(45) Date of Patent: Sep. 11, 2001

(54) INFORMATION REPRODUCING APPARATUS AND REPRODUCING METHOD

(75) Inventors: Shigeo Yamaguchi; Junichi Horigome, both of Kanagawa; Takayoshi Chiba, Tokyo, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/072,505

(22) Filed: May 4, 1998

(30) Foreign Application Priority Data

May 8, 1997 (JP) .................................................. 9-118323

(51) Int. Cl.[7] .................................................. H04L 27/06
(52) U.S. Cl. ............................................. 375/341; 714/795
(58) Field of Search ............................... 375/341, 262, 375/340, 342; 714/786, 791, 794, 795, 796; 360/32, 41, 51; 369/47, 59, 48

(56) References Cited

U.S. PATENT DOCUMENTS

| | | | |
|---|---|---|---|
| 5,361,247 | * 11/1994 | Fuji et al. | 369/48 |
| 5,424,882 | 6/1995 | Kazawa | 360/46 |
| 5,506,827 | 4/1996 | Tobita | 369/59 |
| 5,517,476 | 5/1996 | Hayashi | 369/59 |
| 5,602,858 | 2/1997 | Kitaori | 371/43 |
| 5,684,773 | * 11/1997 | Hayashi | 369/59 |
| 5,764,608 | * 6/1998 | Satomura | 369/48 |
| 5,809,071 | * 9/1998 | Kobayashi et al. | 375/229 |
| 5,815,515 | * 9/1998 | Dabiri | 714/795 |
| 5,844,946 | * 12/1998 | Nagayasu | 375/341 |
| 5,901,128 | * 5/1999 | Hayashi et al. | 369/59 |
| 5,917,859 | * 6/1999 | Yamasaki et al. | 375/262 |
| 5,917,862 | * 6/1999 | Shimoda | 375/341 |
| 5,953,383 | * 9/1999 | Kojima | 375/347 |
| 5,986,987 | * 11/1999 | Taguchi et al. | 369/48 |
| 6,108,158 | * 8/2000 | Katayama et al. | 360/77.04 |

OTHER PUBLICATIONS

U.S. application No. 09/057,796, filed Apr. 9, 1998.
U.S. application No. 09/059,477, filed Apr. 13, 1998.
U.S. application No. 09/066,190, filed Apr. 24, 1998.
Patent Abstracts of Japan, JP 8–069672, Published Mar. 12, 1996, Hitachi Ltd.
Patent Abstracts of Japan, JP 8–084047, Published Mar. 26, 1996, Toshiba Corp.

* cited by examiner

Primary Examiner—Chi Pham
Assistant Examiner—Emmanual Bayard
(74) Attorney, Agent, or Firm—Oblon, Spivak, McClelland, Maier & Neustadt, P.C.

(57) ABSTRACT

In a magneto-optic disc apparatus corresponding to six-value four-status Viterbi decoding method, an RAA has 12 registers so as to separately adapt amplitude reference values for an address portion and amplitude reference values for a data portion on a magneto-optic disc. Normally, stored values of the registers at the time a reproducing operation has been just completed are used for initial values for an adapting process in the next reproducing operation. On the other hand, when data cannot be correctly reproduced and thereby a read-retry operation or the like is preformed, predetermined values that are stored in 12 registers in the RAA are used as initial values. In this case, the adapting process for amplitude reference values is not performed.

20 Claims, 23 Drawing Sheets

Fig. 2
| RECORD DATA | 1 | 1 | 1 | 1 | 0 | 1 | 0 | 1 |
PIT IN MARK POSITION
RECORDING METHOD
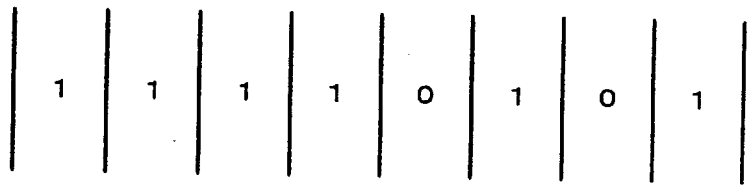
PIT IN MARK EDGE
RECORDING METHOD

Fig. 4
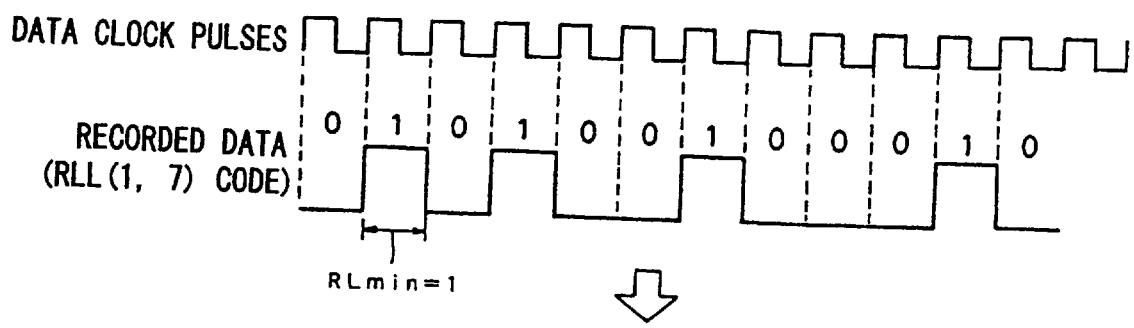
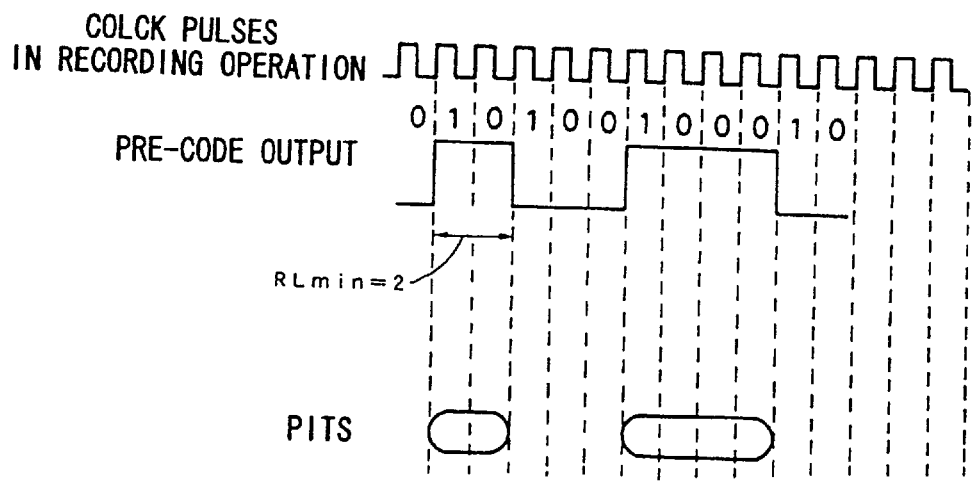

Fig. 9

| | |
|---|---|
| S3 ○ → ○<br>S2 ○ → ○<br>S1 ○ → ○<br>S0 ○ → ○ | $m(0, k-1)+z[k] < m(3, k-1)+\alpha*z[k]-\beta$<br>&& $m(2, k-1)-z[k] < m(1, k-1)-\alpha*z[k]-\beta$ |
| | $m(0, k) = m(0, k-1)+z[k]$<br>$m(1, k) = m(0, k-1)+\alpha*z[k]-\beta$<br>$m(2, k) = m(2, k-1)-z[k]$<br>$m(3, k) = m(2, k-1)-\alpha*z[k]-\beta$ |
| S3 ○ → ○<br>S2 ○ → ○<br>S1 ○ → ○<br>S0 ○ → ○ | $m(0, k-1)+z[k] \geqq m(3, k-1)+\alpha*z[k]-\beta$<br>&& $m(2, k-1)-z[k] < m(1, k-1)-\alpha*z[k]-\beta$ |
| | $m(0, k) = m(3, k-1)+\alpha*z[k]-\beta$<br>$m(1, k) = m(0, k-1)+\alpha*z[k]-\beta$<br>$m(2, k) = m(2, k-1)-z[k]$<br>$m(3, k) = m(2, k-1)-\alpha*z[k]-\beta$ |
| S3 ○ → ○<br>S2 ○ → ○<br>S1 ○ → ○<br>S0 ○ → ○ | $m(0, k-1)+z[k] < m(3, k-1)+\alpha*z[k]-\beta$<br>&& $m(2, k-1)-z[k] \geqq m(1, k-1)-\alpha*z[k]-\beta$ |
| | $m(0, k) = m(0, k-1)+z[k]$<br>$m(1, k) = m(0, k-1)+\alpha*z[k]-\beta$<br>$m(2, k) = m(1, k-1)-\alpha*z[k]-\beta$<br>$m(3, k) = m(2, k-1)-\alpha*z[k]-\beta$ |
| S3 ○ → ○<br>S2 ○ → ○<br>S1 ○ → ○<br>S0 ○ → ○ | $m(0, k-1)+z[k] \geqq m(3, k-1)+\alpha*z[k]-\beta$<br>&& $m(2, k-1)-z[k] \geqq m(1, k-1)-\alpha*z[k]-\beta$ |
| | $m(0, k) = m(3, k-1)+\alpha*z[k]-\beta$<br>$m(1, k) = m(0, k-1)+\alpha*z[k]-\beta$<br>$m(2, k) = m(1, k-1)-\alpha*z[k]-\beta$<br>$m(3, k) = m(2, k-1)-\alpha*z[k]-\beta$ |

Fig. 20

| sm[k+n−1] | sm[k+n] | DECODED DATA VALUE |
|---|---|---|
| 0  0 | 0  0<br>0  1 | 0<br>1 |
| 0  1 | 1  1 | 0 |
| 1  1 | 1  1<br>1  0 | 0<br>1 |
| 1  0 | 0  0 | 0 |

Fig. 22

| MOGATE SIGNAL | sm[k+n-1] | sm[k+n] | ENABLE SIGNAL TO BE ACTIVE |
|---|---|---|---|
| ACTIVE | 00 | 00 | D000 |
| | | 01 | D001 |
| | 01 | 11 | D011 |
| | 11 | 11 | D111 |
| | | 10 | D110 |
| | 10 | 00 | D100 |
| NOT ACTIVE | 00 | 00 | A000 |
| | | 01 | A001 |
| | 01 | 11 | A011 |
| | 11 | 11 | A111 |
| | | 10 | A110 |
| | 10 | 00 | A100 |

INFORMATION REPRODUCING APPARATUS AND REPRODUCING METHOD

BACKGROUND OF THE INVENTION

1. Field of the Invention

The present invention relates to an information reproducing apparatus such as a magneto-optic disc apparatus, in particular, to an information reproducing apparatus using PRML (Partial Response Maximum Likelihood) method and a reproducing method thereof.

2. Description of the Related Art

In a format of a record medium used for a recording/reproducing apparatus, sectors composed of an address portion and a data portion are defined. On a magneto-optic disc, the address portion is embossed. The data portion is magneto-optically recorded. The address portion is reproduced corresponding to the intensity of reflected light. The data portion is reproduced corresponding to magnetic Keer effect. In an information reproducing apparatus that does not use the Viterbi decoding method, since two types of signals that are theoretically different are reproduced by the same digitizing circuit, signals are recorded in such a manner that a signal reproduced from the address portion adequately matches a signal reproduced from the data portion.

In the reproducing system, the gain of an amplifier and of the characteristic of a filter for the address portion and those for the data portion are separately designated so that the signal reproduced from the data portion adequately matches the signal reproduced from the address portion and these signals are supplied to the digitizing circuit. However, in this method, the amplifier and the filter should be disposed for each of the address portion and the data portion. Thus, the circuit scale and the power consumption increase.

In recent years, in an information reproducing apparatus such as a magneto-optic disc apparatus, as a decoding method for decoding a signal reproduced from a record medium, Viterbi decoding method has been widely used. The Viterbi decoding method allows a bit error rate that takes place in decoding a reproduced signal including a white noise to decrease.

Next, an outline of the Viterbi decoding method will be described. A plurality of statuses corresponding to a recording method for a record medium are identified. The maximum likelihood status transition is selected at each read clock pulse by a calculating process corresponding to a signal reproduced from the record medium. Corresponding to the selected result, decoded data is generated as a sequence of decoded data values "1" or "0".

The calculating process corresponding to the reproduced signal is performed with reference to an amplitude reference value that depends on the type of Viterbi decoding method. When a reproduced signal is an ideal signal that is not affected by the fluctuation of the amplitude, the amplitude reference value logically depends on the type of Viterbi decoding method.

However, generally, due to various factors such as fluctuation of amplitude, an amplitude reference value for accurately decoding a reproduced signal fluctuates. However, since the fluctuation is not constant, the amplitude reference value cannot be shifted for improving the decoding accuracy. Thus, by updating the amplitude reference value corresponding to the fluctuation of the amplitude of the reproduced signal, the amplitude reference value should be adapted for the reproduced signal.

To do that, generally, the amplitude of a reproduced signal is detected by a means such as an envelope detector. Corresponding to the detected value, the amplitude reference value is updated at predetermined time intervals.

In a Viterbi decoder that adapts an amplitude reference value to a reproduced signal, even if the characteristic of a reproduced signal of the address portion is different from that of the data portion, amplitude reference values thereof are adapted to the respective reproduced signals.

An amplitude reference value is adapted for each sector as a data unit of the reproducing operation. As an initial value of an amplitude reference value adapted for a reproduced signal, a predetermined value such as a theoretical value is used. However, with such an initial value, when a new sector is reproduced, an amplitude reference value that has been adapted in the just preceding reproducing operation cannot be used.

Generally, the characteristic of a signal reproduced from the same record medium does not largely vary sector by sector. Thus, the adaptivity of the amplitude reference value adapted to a signal reproduced from a new sector by the just preceding reproducing operation is higher than the adaptivity of a predetermined value such as a theoretical value.

Thus, when a predetermined value such as a theoretical value is used as an initial value of an amplitude reference value, the amplitude reference value deviates from the characteristic of a reproduced signal in the convergence time period that depends on a correction coefficient used in the adapting process. In this period, the probability of which the accuracy of the Viterbi decoding process decreases is high.

As a result of the adapting process for an amplitude reference value to a reproduced signal, an abnormal amplitude reference value may take place. As one cause, the reproduced signal may largely disorder due to for example a defect of a record medium. When the adapting process is performed with such a disordered reproduced signal, an abnormal amplitude reference value may take place. With the abnormal amplitude reference value, since the accuracy of the Viterbi decoding process decreases, a signal may not be correctly reproduced.

Generally, when a signal is not correctly reproduced in the information reproducing apparatus, a sector that has not been correctly reproduced is reproduced once again (namely, a read-retry operation is performed). When the amplitude reference value at which the just preceding reproducing operation (namely, the reproducing operation for a sector that has not been correctly reproduced) has been performed is used as an amplitude reference value for the read-retry operation, as described above, the Viterbi decoding process is performed with the abnormal amplitude reference value. Thus, the probability of which a signal is not correctly reproduced is high.

In addition, the probability of which a sector that has not been correctly reproduced has a defect or the like is high. In the read-retry operation for such a sector, when the amplitude reference value is adapted, an abnormal amplitude reference value due to a defect or the like may take place. Thus, the probability of which a signal is not correctly reproduced is high.

On the other hand, when a plurality of sectors are reproduced, an address portion and a data portion are alternately reproduced. However, when amplitude reference values are used for the address portion and the data portion, just after the address portion has been reproduced, an amplitude reference value that has been adapted corresponding to the characteristic of a signal reproduced from the data portion is used. In contrast, just after the data portion has been reproduced, an amplitude reference value that has been adapted corresponding to the characteristic of a signal reproduced from the address portion is used.

Thus, just after the address portion or the data portion has been reproduced, the amplitude reference value may largely deviate from the characteristic of the reproduced signal. With the amplitude reference value, the decoding accuracy of the Viterbi decoding process may deteriorate.

OBJECTS AND SUMMARY OF THE INVENTION

Therefore, an object of the present invention is to provide an information reproducing apparatus that allows a read-retry process to be performed in the case that a signal has not been correctly reproduced with a proper amplitude reference value in Viterbi decoding method for adapting an amplitude reference value and allows a good decoding accuracy to be obtained in the case that the qualities of reproduced signals of two types of areas on a record medium (for example, an address portion and a data portion of for example a magneto-optic disc). Another object of the present invention is to provide a reproducing method of such an information reproducing apparatus.

The invention of claim 1 is an information reproducing apparatus for reproducing data on a record medium corresponding to Viterbi decoding method, the data having been recorded with an RLL code, the apparatus comprising Viterbi decoding means for calculating a branch metric in each status with an input reproduced signal and an amplitude reference value and selecting the maximum likelihood status transition with an added value of the calculated branch metric and a past path metric, amplitude reference value adapting means for updating the amplitude reference value with the selected maximum likelihood status transition and the reproduced signal corresponding to each clock pulse, and initial value setting means for setting an initial value of the amplitude reference value corresponding to a plurality of reproducing operations.

The invention of claim 10 is an information reproducing method for decoding a signal reproduced from a record medium corresponding to Viterbi decoding method, comprising the steps of (a) updating an amplitude reference value used as a reference value for calculating a branch metric of a reproduced signal with the value of the reproduced signal and a result of the Viterbi decoding method corresponding to each clock pulse, and (b) setting an initial value of the amplitude reference value for a plurality of reproducing operations corresponding to step (a).

According to the present invention, if a signal has not been correctly reproduced, when a read-retry operation is performed, an initial value of an amplitude reference value for the read retry operation can be properly designated. In addition, the availability of the adapting process of an amplitude reference value for the read-retry operation can be controlled.

For example, in a magneto-optic disc apparatus, when a storing means for storing an amplitude reference value for the address portion and a storing means for storing an amplitude reference value for the data portion are separately disposed, the amplitude reference values are separately adapted for the address portion and the data portion. Thus, with a reproducing system composed of a waveform equalizer and an amplifier, both signals reproduced from the address portion and the data portion can be accurately decoded corresponding to Viterbi decoding method.

The above, and other, objects, features and advantage of the present invention will become readily apparent from the following detailed description thereof which is to be read in connection with the accompanying drawings.

BRIEF DESCRIPTION OF THE DRAWINGS

FIG. 2 is a schematic diagram for explaining a mark position recording method and a mark edge recording method;

FIG. 4 is a schematic diagram showing that the minimum magnetizing inversion width is 2 in RLL(1, 7) code encoding method;

FIG. 9 is a schematic diagram showing a condition of a status transition corresponding to a standardized metric in the four-value four-status Viterbi decoding method;

FIG. 20 is a schematic diagram for explaining an example of a matrix table referenced by a merge block according to an embodiment of the present invention;

FIG. 22 is a block diagram for explaining an example of a matrix table referenced by the RAA according to an embodiment of the present invention;

DETAILED DESCRIPTION OF THE PREFERRED EMBODIMENTS

For easy understanding of the present invention, as an example of a recording/reproducing apparatus having a reproducing system corresponding to Viterbi decoding method, the overall structure of the apparatus, the sector format of a record medium, an outline of a four-value four-status Viterbi decoding method, the structure and operation of a Viterbi decoder that accomplishes the four-value four-status Viterbi decoding method, and another Viterbi decoding method other than the four-value four-status Viterbi decoding method will be described one after the other.

[Outline of Disc Recording/Reproducing Apparatus]

Figure 1:
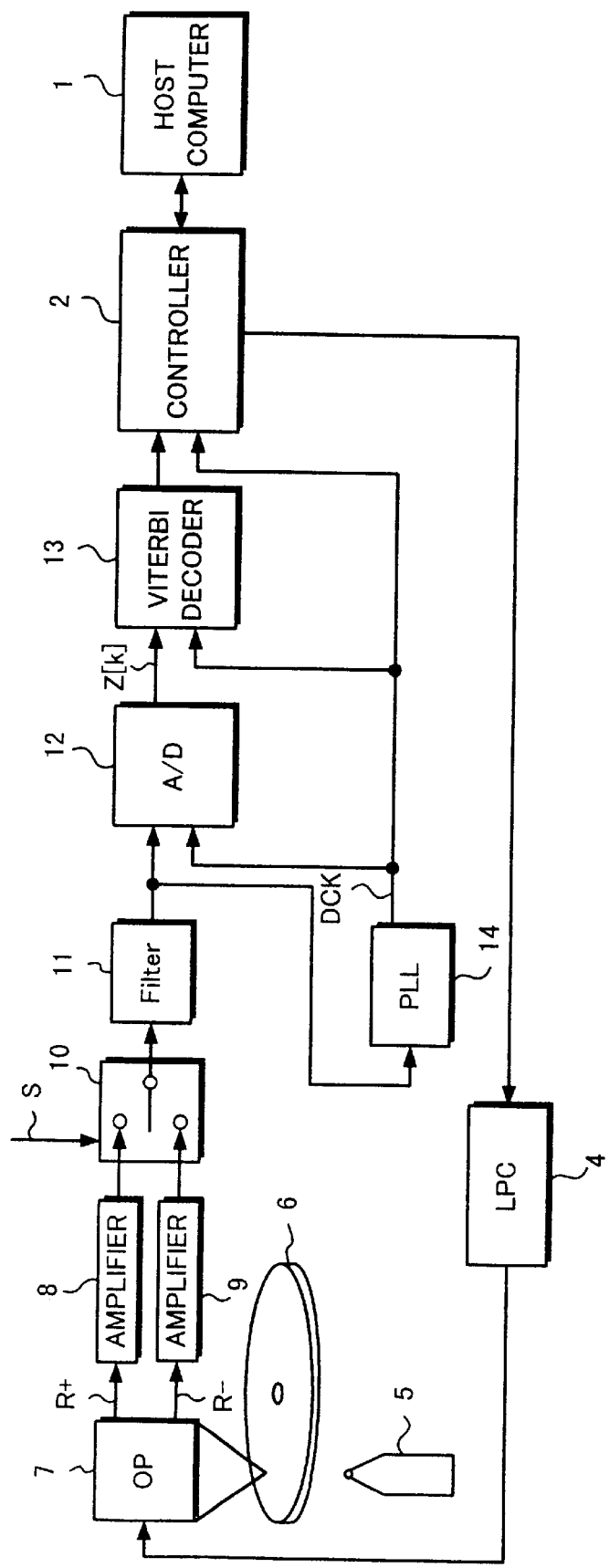
FIG. 1 is a block diagram showing the overall structure of an example of a magneto-optic disc apparatus that performs four-value four-status Viterbi decoding method.

Next, an example of a recording/reproducing apparatus having a reproducing system corresponding to the Viterbi decoding method will be described. FIG. 1 is a block diagram showing the overall structure of a magneto-optic disc apparatus having a reproducing system corresponding to the Viterbi decoding method. When a recording operation is performed, a controller 2 receives user data to be recorded corresponding to a command issued by a host computer 1 and encodes the user data as information words to RLL(1, 7) code as code words. The code words are supplied as record data to a laser power controlling portion (LPC) 4. In addition, the controller 2 performs a decoding process (that will be described later), controlling processes for a recording mode, a reproducing mode, and an erasing mode, and an communication operation with the host computer 1.

The LPC 4 controls a laser power of an optical pickup 7 corresponding to the supplied record data so as to form a pit sequence with magnetic polarities on a magneto-optic disc 6. When the data is recorded, a magnetic head 5 applies a bias magnetic field to the magneto-optic disc 6. Actually, the data is recorded in a mark edge recoding method corresponding to a pre-code output (that will be described later) generated corresponding thereto.

As will be described later, a record position (namely, a pit position) is controlled by a particular means (not shown) that aligns the magnetic head 5 and the optical pickup 7. Thus, in the recording mode, when the optical pickup 7 passes an address portion, the similar operation is performed as with the reproducing mode.

Next, with reference to FIG. 2, a method for causing each pit formed in the above-described manner to correspond to each bit of a pre-code generated corresponding to record data will be described. A recording method of which "0" or "1" of a pre-code represents the presence or absence of a pit formed on a record medium is referred to as mark position recording method. On the other, a recording method of which the inversion of the polarity at the boundary of each bit of a pre-code represents "1" is referred to as mark edge recording method. When a signal is reproduced, the boundary of each bit of a reproduced signal is recognized corresponding to a read clock pulse DCK (that will be described later).

Next, the structure and operation of the reproducing system will be described. The optical pickup 7 radiates laser light to the magneto-optic disc 6, receives the reflected light thereof, and reproduces a signal corresponding to the reflected light. The reproduced signal is composed of four signals that are a sum signal $R_+$, a difference signal $R_-$, a focus error signal, and a tracking error signal (the focus error signal and the tracking error signals are not shown). The sum signal $R_+$ is supplied to an amplifier 8. The amplifier 8 adjusts for example the gain of the sum signal $R_+$. The resultant sum signal $R_+$ is supplied to a selection switch 10. On the other hand, the difference signal $R_-$ is supplied to an amplifier 9. The amplifier 9 for example adjusts the gain of the difference signal $R_-$. The resultant difference signal $R_-$ is supplied to the selection switch 10. The focus error signal is supplied to a means (not shown) that removes a focus error. The tracking error signal is supplied to a servo system (not shown).

A selection signal S (that will be described later) is supplied to the selection switch 10. The selection switch 10 supplies the sum signal $R_+$ or the difference signal $R_-$ to a filter portion 11 corresponding to the selection signal S. In other words, corresponding to a sector format of the magneto-optic disc 6, while a signal reproduced from an embossed portion is being supplied to the selection switch 10, the sum signal $R_+$ is supplied to the filter portion 11. While a signal reproduced from a magneto-optically recorded portion is being supplied to the selection switch 10, the difference signal $R_-$ is supplied to the filter portion 11.

The selection signal S is generated in the following manner. A signal that is reproduced from a predetermined pattern defined in a sector format is detected from the reproduced signal. An example of the predetermined pattern is a sector mark SM (that will be described later). When such a signal is detected, by counting the number of read clock pulses, the selection signal is generated.

The filter portion 11 is composed of a low pass filter that does not pass a noise component and a waveform equalizer that equalizes the waveform of a signal. As will be described later, the waveform equalizing characteristic in the waveform equalizing process corresponds to Viterbi decoding method of a Viterbi decoder 13. An A/D converter 12 that receives an output signal of the filter portion 11 samples a reproduced signal value z[k] corresponding to the read clock pulses DCK (that will be described later). The Viterbi decoder 13 generates decoded data with a reproduced signal value z[k] corresponding to the Viterbi decoding method. The decoded data is the maximum likelihood decoded data sequence of the recorded data. Thus, when there is no error in decoded data, the decoded data accords with the recorded data.

The decoded data is supplied to the controller 2. As described above, the recorded data is code words of which user data has been encoded by a channel-encoding process. Thus, when the error rate of decoded data is sufficiently low, the decoded data can be treated as recorded data as code words. The controller 2 performs the decoding process corresponding to the channel-encoding process for the decoded data and reproduces the user data and so forth.

Output data of the filter portion 11 is also supplied to a PLL portion 14. The PLL portion 14 generates the read clock pulses DCK corresponding to the signal received from the filter portion 11. The read clock pulses SCK are sent to the controller 2, the A/D converter 12, the Viterbi decoder 13, and so forth. The controller 2, the A/D converter 12, and the Viterbi decoder 13 operate corresponding to the read clock pulses DCK. In addition, the lead clock pulses DCK are supplied to a timing generator (not shown). The timing generator generates a signal that controls the operation timing of the apparatus such as the switching operation between the recording operation and the reproducing operation.

In the above-described reproducing operation, the operations of the individual structural portions of the reproducing system are adapted so as to obtain correct reproduced data corresponding to the signal reproduced from the magneto-optic disc 6. Such an operation is referred to as calibration. The calibration is performed for adapting parameters of the reproducing system because the quality of a reproduced signal varies corresponding to the characteristics of a record medium (such as machining accuracy), the fluctuation of the power of recording laser light, and the recording/reproducing conditions (such as ambient temperature).

The calibration includes an adjustment of the power of reading laser light of the optical pickup 7, adjustments of the gains of the amplifiers 8 and 9, an adjustment of the waveform equalizing characteristics of the filter portion 11, and adjustments of amplitude reference values of the Viterbi decoder 13. The calibration is performed by a structure not shown in FIG. 1 just after the power of the apparatus is turned on or when a record medium is replaced with another one.

[Outline of Sector Format of Record Medium]

Figure 3A:
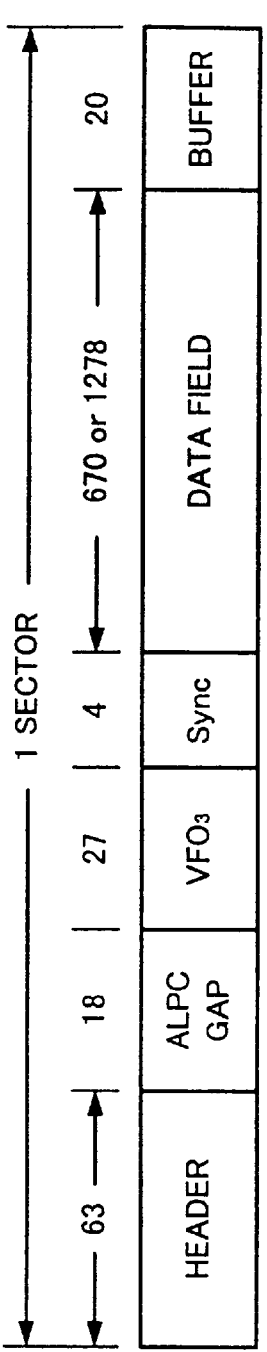
FIGS. 3A to 3C are schematic diagrams for explaining an example of a sector format of a magneto-optic disc.
Figure 3B:
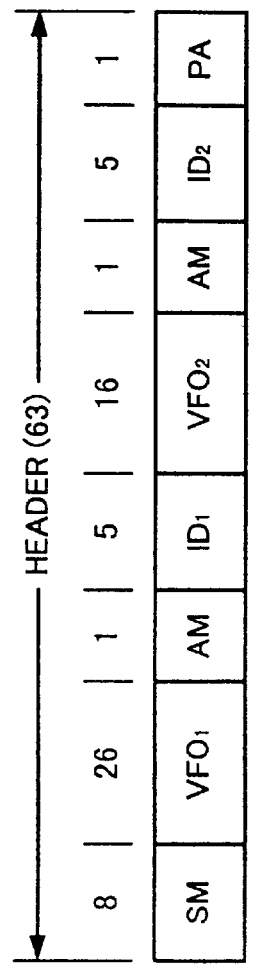
Figure 3C:
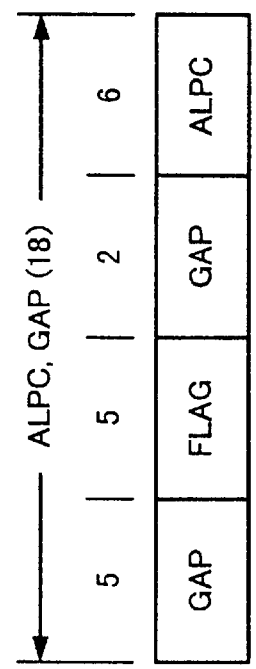

User data as sectors that are recording/reproducing data units are recorded on the magneto-optic disc 6. Next, with reference to FIGS. 3A to 3C, an example of the sector format of the magneto-optic disc 6 will be described. As shown in FIG. 3A, one sector has areas of a header, an ALPC, a gap, a $VFO_3$, a sync, a data field, and a buffer. In FIGS. 3A to 3C, numerals in individual areas represent bytes of data. Data that has been encoded by block encoding method is recorded on the magneto-optic disc 6. For example, data of eight bits is converted into data of 12 channel bits and recorded.

For example, there are two types of sector formats that are 1024-byte format and 512-byte format as the amount of user data. In the 1024-byte format, the number of bytes in the data field is 670 bytes. In the 512-byte format, the number of bytes in the data filed is 1278 bytes. The pre-formatted header (63 bytes) and the ALPC and gap area (18 bytes) in the 1024-byte format are the same as those in the 512-byte format.

FIG. 3B shows the header composed of 63 bytes. The header has a sector mark SM (8 bytes), a $VFO_1$ (26 bytes) of a VFO field, an address mark AM (1 byte), an $ID_1$ (5 bytes) of an ID field, a $VFO_2$ (16 bytes) of the VFO field, an address mark AM (1 byte), an $ID_2$ (5 bytes) of the ID field, and a post-amble PA (1 byte).

FIG. 3C shows the ALPC and gap area composed of 18 bytes. The ALPC and gap area has a gap field (5 bytes), a flag field (5 bytes), a gap field (2 bytes), and an ALPC (6 bytes).

Next, these fields will be described. The sector mark SM identifies the beginning of a sector. The sector mark SM has an embossed pattern that does not take place in the RLL(1, 7) code. The VFO field synchronizes with a VFO (Variable Frequency Oscillator) of the PLL portion 18. The VFO field is composed of the $VFO_1$, the $VFO_2$, and the $VFO_3$. $VFO_1$ and $VFO_3$ are embossed. The $VFO_3$ are magneto-optically written when the recording operation is performed for a relevant sector. The $VFO_1$, the $VFO_2$, and the $VFO_3$ have patterns of which channel bits "0" and "1" alternately take place. These patterns are referred to as 2T patterns. Thus, assuming that the time period of one channel bit is denoted by T, when the VFO field is reproduced, a signal of which the level is inverted at intervals of 2T is obtained.

The address mark AM is used to synchronize with the next ID field for each byte. The address mark AM has an embossed pattern that does not take place in the RLL(1, 7) code. The ID field has the address of a relevant sector (namely, information of a track number and a sector number) and a CRC byte for detecting an error thereof. The ID field is composed of five bytes. With the $ID_1$ and $ID_2$, the same address information is redundantly recorded. The post amble PA has a pattern of which channel bits "0" and "1" alternately take place (namely, a 2T pattern). The $ID_1$, $ID_2$, and the post amble PA are embossed. Thus, the header area is a pre-formed area of which pits have been embossed.

FIG. 3C shows the gap area. In the gap area, pits are not formed. The first gap field (5 bytes) is a field just preceded by the pre-formatted header. The first gap field is used to assure the time period that the apparatus requires to process the header. The second gap field (2 bytes) is used to absorb the deviation of the position of the $VFO_3$.

In the ALPC and gap area, a flag field of five bytes is recorded. When data of a relevant sector is recorded, 2T patterns are successively recorded in the flag field. The ALPC (Auto Laser Power Control) field is disposed to test the laser power in the recording mode. A sync field (4 bytes) is used to cause the apparatus to synchronize with the next data field for each byte.

The data field is used to record user data. The data field of 670 bytes has user data (512 bytes), an error detection/correction parity (144 bytes), a sector write flag (12 bytes), and two bytes (FF). On the other hand, the data field of 1278 bytes has user data (1024 bytes), an error detection/correction parity (242 bytes), and a sector write flag (12 bytes). The buffer field at the last of the sector is used as a tolerance for an electric/mechanical error.

In the above-described sector formats, the header is an area of which pits are embossed. The ALPC and the gap area are not used in the reproducing operation. The $VFO_3$, the sync field, and the data field are data areas that have been magneto-optically recorded.

[Outline of Four-value Four-status Viterbi Decoding Method]

Next, the Viterbi decoding method of the Viterbi decoder 13 will be described. As described above, user data is converted into code words as recorded data by various encoding methods. A proper encoding method is used corresponding to the characteristic of a record medium and a recording/reproducing method. In the magneto-optic disc apparatus, in a block encoding process, RLL (Run Length Limited) encoding method that limits the run length (namely, the number of "0"s between "1" and "1") has been widely used. There are several RLL encoding methods. Generally, m/n block code of which the number of "0"s between "1" and "1" is at least d and at most k is referred to as RLL(d, k; m, n) code.

For example, with the 2/3 block code, the block encoding method of which the number of "0"s between "1" and "1" is at least one and at most seven is RLL(1, 7; 2, 3) code. Generally, the RLL(1, 7; 2, 3) code is sometimes referred as to RLL(1, 7) code. Thus, in the following description, RLL(1, 7) code represents RLL(1, 7; 2, 3) code.

To decode a signal reproduced from data that has been recorded by a combination of the RLL encoding method and the mark edge recording method, the Viterbi decoding method can be used.

The RLL encoding method satisfies the conditions required for the encoding method from two view points of the improvement of the record density and the stability of the reproducing operation. As described above, in the mark edge recording method, since "1" of a pre-code generated with recorded data corresponds to the inversion of the polarity represented by an edge of each pit, as the number of "0" s between "1" and "1" is large, the number of bits recorded in each pit can be increased. Thus, the record density can be increased.

On the other hand, the read clock pulses DCK that cause the operations of the structural portions of the reproducing system to match are generated by the PLL portion 14 corresponding to a reproduced signal. Thus, as the number of "0"s between "1" and "1" is large, in the reproducing operation, the PLL portion unstably operates. Thus, the entire reproducing operation becomes unstable.

Considering such two conditions, the number of "0"s between "1" and "1" should be in a proper range. For the number of "0" s in recorded data, the RLL encoding method is effective.

As shown in FIG. 4, in the combination of the RLL(1, 7) encoding method and the mark edge recording method, at least one "0" is present between "1" and "1" of a pre-code generated corresponding to record data. Thus, the minimum inversion width is 2. When the encoding method whose minimum inversion width is 2 is used, as a method for reproducing recorded data from a reproduced signal that have been affected by inter-code interference and noise, four-value four-status Viterbi decoding method (that will be described later) can be used.

As described above, the filter portion 11 performs the waveform equalizing process for a reproduced signal. In the waveform equalizing process performed on the preceding stage of the Viterbi decoding process, partial response process that actively uses inter-code interference is used. The waveform equalizing characteristic is obtained in consideration of the linear record density of the recording/reproducing system and the MTF (Modulation Transfer Function) of the partial response characteristics expressed by $(1+D)^n$. The waveform equalizing process using PR(1, 2, 1) code for data recorded in the combination of the RLL(1, 7) encoding method and the mark edge recording method is disposed on the preceding stage of the four-value four-status Viterbi decoding method.

On the other hand, in the mark edge recording method, before data is recorded on a magneto-optic disc medium or the like, a pre-code is generated corresponding to the recorded data encoded by the RLL encoding process or the like. Assuming that the record data sequence at each time point k is denoted by a[k] and a pre-code thereof is denoted by b[k], the pre-code is generated as follows.

$$b[k]=\text{mod } 2\{a[k]+b[k-1]\} \tag{1}$$

The pre-code b[k] is actually recorded on a magneto-optic disc medium or the like. Next, the waveform equalizing process with a waveform equalizing characteristic PR(1, 2, 1) performed by the waveform equalizer of the filter portion 11 will be described. However, in the following description, it is assumed that the amplitude of a signal is not standardized and that the waveform equalizing characteristic is denoted by PR(B, 2A, B). In addition, the value of a reproduced signal that does not consider noise is denoted by c[k]. A really reproduced signal that includes noise (namely, a signal reproduced from a record medium) is denoted by z[k].

With the waveform equalizing characteristic PR(B, 2A, B), the contribution of the amplitude at a time point k is 2A times as large as the value of the reproduced signal at the time point k. In addition, the contribution of the amplitude at the time point k−1 or k+1 is B times as large as the value of the reproduced signal at the time point k−1 or k+1. Thus, with the maximum value of the value of the reproduced signal, pulses are detected at time points k−1, k, and k+1. In this case, the maximum value of the reproduced signal is expressed as follows.

$$B+2A+B=2A+2B$$

The minimum value of the reproduced signal is 0. However, actually, as c[k], A+B of DC component is subtracted as follows.

$$c[k]=B\times b[k-2]+2A\times b[k-1]+B\times b[k]-A-B \tag{2}$$

Figure 5:
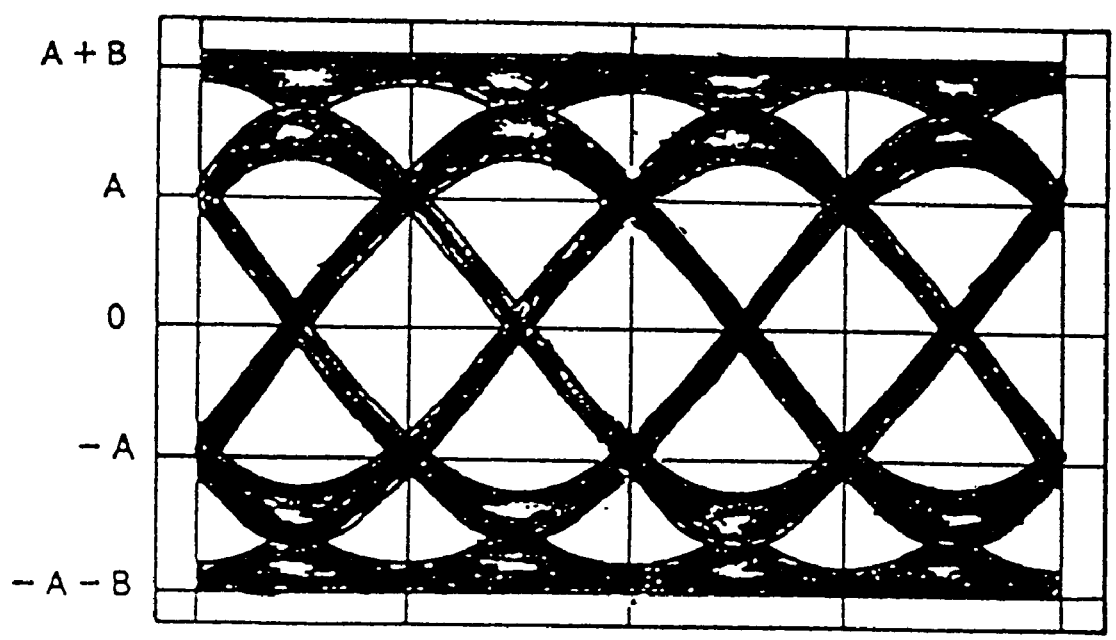
FIG. 5 is a schematic diagram for explaining an eye pattern in the case that a signal reproduced from data that has been recorded in a combination of RLL(1, 7) code encoding method and mark edge recording method is waveform-equalized with partial response characteristic PR(1, 2, 1)

Thus, the reproduced signal c[k] that does not consider noise is one of A+B, A, −A, or −A−B. Generally, as one of methods that represent the characteristic of a reproduced signal, reproduced signals at for example five time points are superimposed. The resultant signal is referred to as eye pattern. FIG. 5 shows an example of an eye pattern of a reproduced signal z[k] of which the magneto-optic disc apparatus according to the present invention has performed the waveform equalizing process with the waveform equalizing characteristic PR(B, 2A, B). FIG. 5 shows that the value of the reproduced signal z[k] at each time point deviates due to noise. However, from FIG. 5 it is clear that the value is one of A+B, A, −A, and −A−B. As will be described later, A+B, A, −A, and −A−B can be used as identification points.

Figure 7:
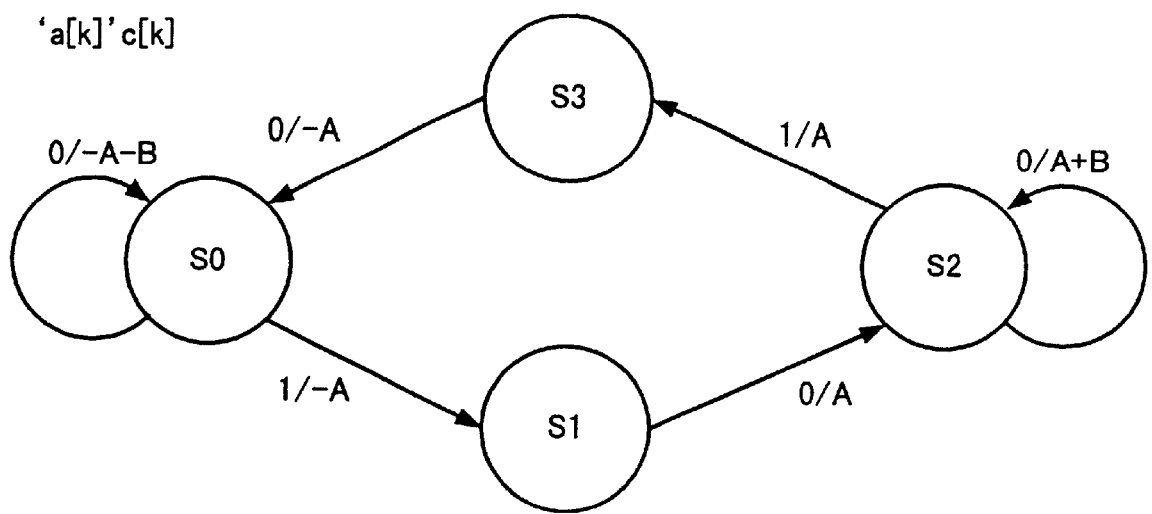
FIG. 7 is a schematic diagram showing an example of a status transition diagram of the four-value four-status Viterbi decoding method.

Next, the Viterbi decoding method for decoding a reproduced signal of which the above-described waveform equalizing process has been performed will be described. At step (1), all possible statuses corresponding to the encoding method and the record medium are obtained. At step (2), starting from each status at a particular time point, all possible status transitions at the next time point, record data a[k] of each status transition, and the value c[k] of the reproduced signal are obtained. A diagram that represents all the statuses and status transitions obtained at steps (1) and (2) and [value a[k] of record data / value c[k] of reproduced signal] in each status transition is referred to as status transition diagram. FIG. 7 shows a status transition diagram in the four-value four-status Viterbi decoding method. The Viterbi decoder 13 is structured so that it performs the decoding operation corresponding to the status transition diagram.

At step (3), based on the status transition diagram, the maximum likelihood status transition corresponding to the signal z[k] reproduced at each time point k from the record medium is selected. However, as described above, the signal z[k] has been waveform-equalized on the preceding stage of the Viterbi decoder 13. Whenever the maximum likelihood status transition is selected, the value of the recorded data a[k] in the status transition diagram is treated as a decoded value. Thus, decoded data a'[k] as the maximum likelihood decoded value sequence to the recorded data can be obtained. However, the maximum likelihood decoded value sequence is obtained from the decoded data value at each time point k is obtained by a PMU 23 of the Viterbi decoder 13. Thus, as described above, when there is no error in decoded data, the decoded data sequence a'[k] matches the recorded data sequence a[k]. Next, step (1) to (3) will be described in detail.

At step (1), a status at a time point k is defined with pre-codes at the time point k and earlier time points as follows. In other words, the status of which n=b[k], m=b[k−1], and 1=b[k−2] is defined as Snml. In this definition, it is considered that there are $2^3=8$ statuses. As described above, statuses that actually take place are restricted by the encoding method and so forth. In the recorded data sequence a[k] encoded with RLL(1, 7) code, since there is at least one "0" between "1" and "1", two or more "1"s do not succeed. A particular condition is applied to a pre-code b[k] corresponding to the conditions of the recorded data sequence a[k]. Thus, the resultant statuses are restricted.

Next, such a restriction will be practically described. As was described, a recorded data sequence that has been encoded with RLL(1, 7) does not include two or more "1"s that succeed. In other words, the following values do not take place.

$$a[k]=1, a[k-1]=1, a[k-2]=1 \quad (3)$$

$$a[k]=1, a[k-1]=1, a[k-2]=0 \quad (4)$$

$$a[k]=0, a[k-1]=1, a[k-2]=1 \quad (5)$$

Corresponding to such a condition for the recorded data sequence, as a condition for b[k] corresponding to Formula (1), it is clear that two statuses S010 and S101 do not take place. Thus, the number of possible statuses is $2^3-2=6$.

Next, at step (2), starting from a status at a particular time point j, to obtain statuses at the next time point j+1, the cases of which the value a[j+1] of recorded data at the time point j+1 is 1 and 0 should be considered.

In this example, the status S000 is considered. Corresponding to Formula (1), there are two recorded data values pre-coded as the status S000 (namely, n=b[j]=0, 1=b[j−1]=0, m =b[j−2]=0) as follows.

$$a[j]=0, a[j-1]=0, a[j-2]=1 \quad (6)$$

$$a[j]=0, a[j-1]=0, a[j-2]=0 \quad (7)$$

[when a[j+1]=1]
At this point, corresponding to Formula (1), b[j+1] is calculated as follows.

$$b[j+1] = \text{mod } 2\{a[j+1]+b[j]\} \quad (8)$$
$$= \text{mod } 2\{1+0\}$$
$$= 1$$

Thus, the value of the reproduced signal c[j] is calculated corresponding to Formula (2) as follows.

$$c[j+1] = \{B \times b[j+1] + 2A \times b[j] + B \times b[j-1]\} \quad (9)$$
$$= -A - B$$
$$= \{B \times 1 + 2A \times 0 + B \times 0\} - A - B$$
$$= -A$$

In addition, in the status Snlm at the next time point j+1, the conditions of n=b[j+1], 1=b[j], and m=b[j−1] are satisfied. As described above, since b[j+1]=1, b[j]=0, and b[j−1]=0, the status at the next time point j+1 is S100. Thus, when a[j+1]=1, a transition S000→S100 takes place.
[when a[j+1]=0]
At this point, corresponding to Formula (1), b[j+1] is calculated as follows.

$$b[j+1] = \text{mod } 2\{a[j+1]+b[j]\} \quad (10)$$
$$= \text{mod } 2\{0+0\}$$
$$= 0$$

Thus, the value of the reproduced signal c[j+1] is calculated corresponding to Formula (2) as follows.

$$c[j+1] = \{B \times b[j+1] + 2A \times b[j] + B \times b[j-1]\} - A - B \quad (11)$$
$$= \{B \times 0 + 2A \times 0 + B \times 0\} - A - B$$
$$= -A - B$$

In the status Snlm at the next time point j+1, the conditions of n=b[j+1], 1=b[j], and m=b[j−1] are satisfied. As described above, since conditions of b[j+1]=0, b[j]=0, and b[j−1]=0 are satisfied, the status at the next time point is S000. Thus, when a[j+1]=0, a transition S000→S000 takes place.

Thus, in each status other than S000 at the time point j, the relation between status transitions starting from the status S000 at the next time point j+1 and recorded data values a[j+1] and reproduced signal values c[j+1] in each of the status transitions can be obtained.

Figure 6:
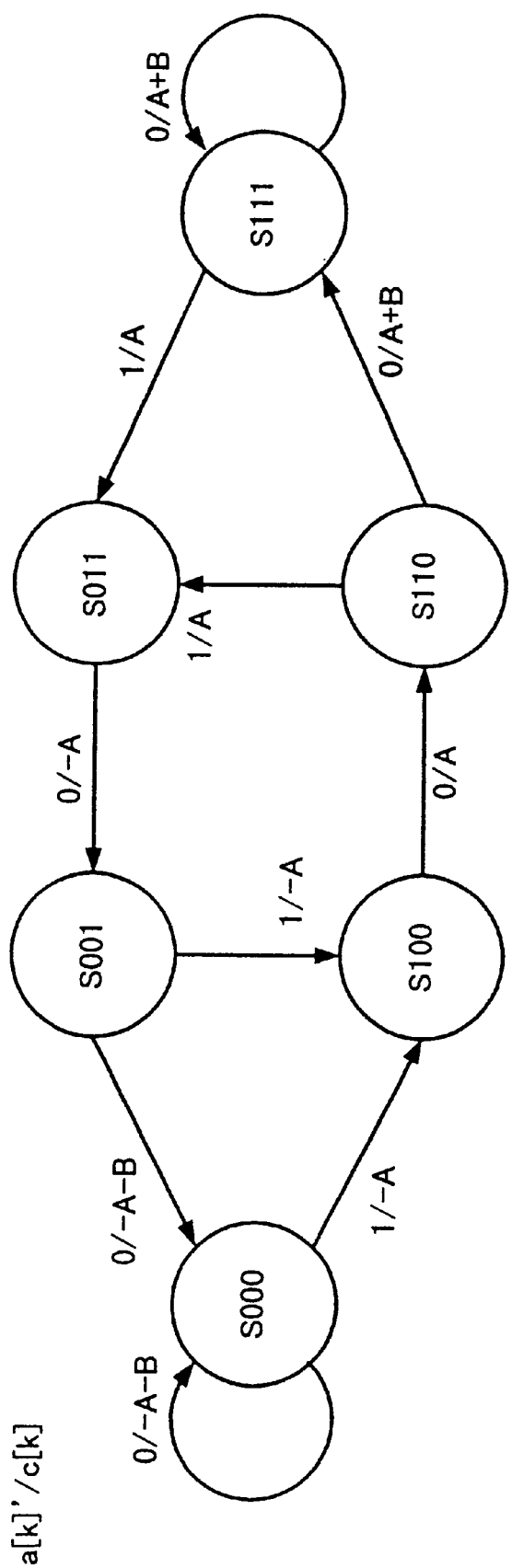
FIG. 6 is a schematic diagram for explaining a process for creating a status transition diagram of the four-value four-status Viterbi decoding method.

The relation between status transitions starting from each status and recorded data values and reproduced signal values in each of the status transitions is represented by a diagram shown in FIG. 6. The time points j and j+1 are not special time points. Thus, the relation between status transitions and recorded data values and reproduced signal values can be applied at any time point. Thus, in FIG. 6, a recorded data value and a reproduced signal value in a status transition at any time point k are denoted by a[k] and c[k], respectively.

In FIG. 6, a status transition is represented by an arrow. A code in association with each arrow represents [recorded data value a[k]/reproduced signal value c[k]]. There are two status transitions starting from each of the statuses S000, S001, S111, and S110. On the other hand, there is one status transition starting from each of the statuses S011 and S100.

In FIG. 6, in the statuses S000 and S001, when the recorded data value a[k] is 1, the reproduced signal value c[k] is −A. In this case, each of the statuses S000 and S001 changes to S100. When the recorded data value a[k] is 0, the reproduced signal value c[k] is −A−B. In this case, each of the statuses S000 and S001 changes to S000. In the statuses S111 and S110, when the recorded data value is a[k+1], the reproduced signal value is c[k+1]. In this case, each of the statuses S111 and S110 changes to the same status. Thus, the statuses S000 and S001 are denoted by S0. The statuses S111 and S110 are denoted by S2. In FIG. 7, the statuses S011 and S100 are denoted by S3 and S1, respectively.

As described above, FIG. 7 is a status transition diagram of four-value four-status Viterbi decoding method. FIG. 7 shows four statuses S0 to S4 and four reproduced signal values c[k+1]=−A−B, −A, A, and A+B. There are two status transitions starting from each of the statuses S0 and S2. There is only one status transition starting from each of the statuses S1 and S3.

Figure 8:
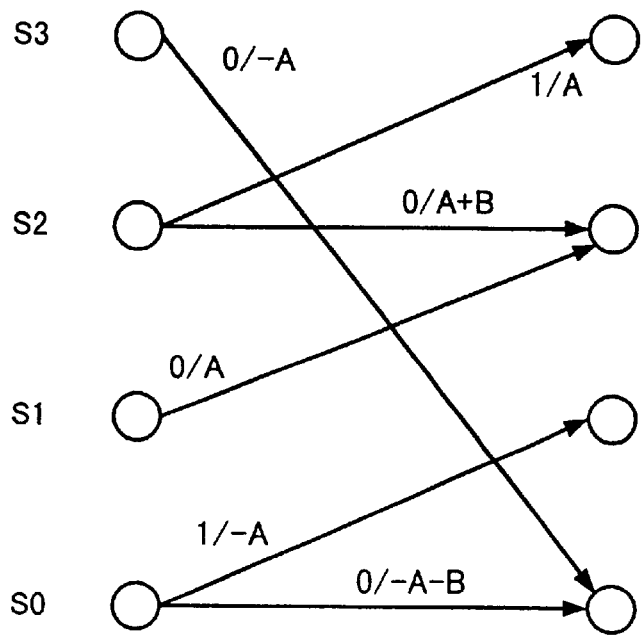
FIG. 8 is a schematic diagram showing an example of a Trellis diagram in the four-value four-status Viterbi decoding method.

As a format for chronologically representing status transitions, a trellis diagram as shown in FIG. 8 is used. In FIG. 8, status transitions between two time points are shown. However, it should be noted that transitions among many time points can be represented. In a trellis diagram, as time elapses, statuses changes rightwardly. Thus, a horizontal arrow represents a status transition of the same status (for example, from S0 to S0). On the other hand, a diagonal arrow represents a status transition of different statuses (for example, from S1 to S2).

Next, step (3) of the Viterbi decoding method (namely, based on the status transition diagram shown in FIG. 7, a method for selecting the maximum likelihood status transition from a really reproduced signal z[k] that includes noise) will be described.

To select the maximum likelihood status transition, with respect to a status at a particular time point k, the sums of likelihood of status transitions at a plurality of time points through other statuses are calculated. The sums are compared and the maximum likelihood decoded data sequence is selected. A sum of likelihood of status transitions is referred to as a path metric.

To calculate a path metric, it is necessary to calculate the likelihood of a status transition between two adjacent time points. This calculation is performed with the value of the reproduced signal z[k] corresponding to the above-described status transition diagram in the following manner. Now, consider a status Sa at a time point k−1. When a reproduced signal z[k] is input to the Viterbi decoder 31, the likelihood of a status transition to the status Sb is calculated as follows. In this case, statuses Sa and Sb are selected from four statuses in the status transition diagram shown in FIG. 7.

$$(z[k]-c(Sa, Sb))^2 \tag{12}$$

In Formula (12), c(Sa, Sb) is the value of a reproduced signal in a status transition from the status Sa to the status Sb in the status transition diagram shown in FIG. 7. In other words, in FIG. 7, in the status transition S0→S1, c(Sa, Sb) is −A. Thus, Formula (12) represents an Euclidean distance between the value of the really reproduced signal z[k] that includes noise and the value of the reproduced signal c(Sa, Sb) calculated without considering noise. A path metric at a particular time point is defined as the sum of likelihood of status transitions between adjacent time points.

Now, consider a status Sa at a time point k. In this case, when the status that changes to a status Sa at a time point k−1 is Sp, a path metric L(Sa, k) is calculated with a path metric at a time point k−1 as follows.

$$L(Sa, k)=L(Sp, k-1)+(z[k]-c(Sp, Sa))^2 \tag{13}$$

In other words, by adding a path metric L(Sp, k−1) in the status Sp at the time point k−1 and the likelihood (z[k]−c(Sp, Sa))² of the status transition Sp–Sa between the time point k−1 and the time point k, a path metric L(Sa, k) is calculated. The likelihood of the latest status transition as in (z[k]−c(Sp, Sa))₂ is referred to as branch metric. It should be noted that the branch metric is different from a branch metric calculated by a branch metric calculating circuit (BMC) 20 of the Viterbi decoder 13 (namely, a branch metric corresponding to a standardized metric).

When the status at a time point k is Sa, there may be a plurality of statuses that change to the status Sa at a time point k−1 (as in the status S0 and S2 shown in FIG. 7). When the status at the time point k is S0, the statuses that change to the status S0 at the time point k−1 are two statuses S0 and S3. When the status at the time point k is S2, there are two statuses S1 and S2 that change to the status S2 at the time point k−1. For general description, when the status at the time point k is Sa and the statuses that change to the status Sa at the time point k−1 are two statuses Sp and Sq, the path metric L(Sa, k) is calculated as follows.

$$L(Sa, k)=\min \{L(Sp, k-1)+(z[k]-c(Sp, Sa))^2, L(Sq, k-1)+(z[k]-c(Sq, Sa))^2\} \tag{14}$$

In other words, with respect to each of the case that the status at the time point k−1 is Sp and the status Sp changes to the status Sa by a status transition Sp→Sa and the case that the status at the time point k−1 is Sq and the status Sq changes to the status Sa by a status transition Sq→Sa, the sum of likelihood is calculated. The sums are compared. The smaller value of the sums is defined as a path metric L(Sa, k) for the status Sa at the time point k.

When the calculation for such a path metric is applied to the above-described four values and four statuses shown in FIG. 7, path metrics L(0, k), L(1, k), L(2, k), and L(3, k) of the statuses S0, S1, S2, and S3 at the time point k can be calculated with path metrics L(0, k−1), L(1, k−1), L(2, k−1), and L(3, k−1) in the statuses S0, S1, S2, and S3 at the time point k−1, respectively, as follows.

$$L(0, k)=\min \{L(0, k-1)+(z[k]+A+B)^2, L(3, k-1)+(z[k]+A)^2\} \tag{15}$$

$$L(1, k)=L(0, k-1)+(z[k]+A)^2 \tag{16}$$

$$L(2, k)=\min \{L(2, k-1)+(z[k]-A-B)^2 L(1, k-1)+(z[k]-A)^2\} \tag{17}$$

$$L(3, k)=L(2, k-1)+(z[k]-A)^2 \tag{18}$$

As described above, by comparing the values of the calculated path metrics, the maximum likelihood status transition is selected. To select the maximum likelihood status transition, it is not necessary to calculate the values of the path metrics. Instead, the values of the path metrics are compared. Thus, in the real four-value four-status Viterbi decoding method, when standardized path metrics that are defined as follows are used instead of path metrics, calculations with respect to z[k] at each time point k can be easily performed.

$$m = (i, k) \tag{19}$$
$$= [L(i, k) - z[k]^2 - (A + B)^2]/2/(A + B)$$

When Formula (19) is applied to each of the statuses S0 to S3, standardized path metrics do not include square terms. Thus, the calculations of an adding, comparing, and selecting circuit (ACS) 21 can be simplified.

$$m(0, k)=\min \{m(0, k-1)+z[k], m(3, k-1)+\alpha \times z[k]-\beta\} \tag{20}$$

$$m(1, k)=m(0, k-1)+\alpha \times z[k]-\beta \tag{21}$$

$$m(2, k)=\min \{m(2, k-1)-z[k], m(1, k-1)-\alpha \times z[k]-\beta\} \tag{22}$$

$$m(3, k)=m(2, k-1)+\alpha \times z[k]-\beta \tag{23}$$

where α and β of Formulas (20) to (23) are defined as follows.

$$\alpha=A/(A+B) \tag{24}$$

$$\beta=B \times (B+2 \times A)/2/(A+B) \tag{25}$$

FIG. 9 shows conditions of status transitions of the four-value four-status Viterbi decoding method corresponding to such standardized path metrics. There are two formulas for selecting one from two in the above-described four standardized path metrics. Thus, there are (2×2=4) conditions.

[Outline of Four-value Four-status Viterbi Decoder]

Next, the Viterbi decoder 13 that accomplishes the above-described four-value four-status Viterbi decoding method will be described. The Viterbi decoder 13 comprises a branch metric calculating circuit (BMC) 20, an adding, comparing, and selecting circuit (ACS) 21, a compression and latch circuit 22, and a path memory unit (PMU) 23. The above-described read clock pulses DCK (simply referred to as clock pulses) are supplied to individual structural portions of the decoder 13 so as to match the operation timings of the structural portions of the entire Viterbi decoder 13. Next, the structural portions of the Viterbi decoder 13 will be described one after the other.

The BMC 20 calculates values BM0, BM1, BM2, and BM3 of branch metrics corresponding to standardized path metrics based on an input reproduced signal z[k]. The values BM0 to BM3 are required to calculate the standardized path metrics in Formulas (20) to (23). The values BM0 to BM3 are expressed as follows.

$$BM0 = z(k) \tag{26}$$

$$BM1 = \alpha \times z[k] - \beta \tag{27}$$

$$BM2 = -z(k) \tag{28}$$

$$BM3 = -\alpha \times z[k] - \beta \tag{29}$$

where $\alpha$ and 13 are reference values calculated corresponding to Formulas (24) and (25) by the BMC 20. In these calculations, an envelope is detected corresponding to for example a reproduced signal [k]. $\alpha$ and $\beta$ are calculated corresponding to identification points −A−B, −A, A, and A+B that is detected by an envelop detecting method corresponding to the reproduced signal z[k] and that is supplied to the BMC 20.

The values BM0 to BM3 are supplied to the ACS 21. On the other hand, the ACS 21 receives values M0, M1, M2, and M3 (that have been compressed) of standardized path metrics one clock pulse prior from the compression and latch circuit 22. By adding the values M0 to M3 and BM0 to BM3, the values L0, L1, L2, and L3 of the latest standardized path metrics are calculated. Since the values M0 to M3 have been compressed, L0 to L3 can be prevented from overflowing.

The ACS 21 selects the maximum likelihood status transition (that will be described later) corresponding to the values L0 to L3 of the latest standardized path metrics. Corresponding to the selected result, the signal levels of the selection signals SEL0 and SEL2 supplied to the path memory 23 become "High" or "Low".

The ACS 21 supplies the values L0 to L3 to the compression and latch circuit 22. The compression and latch circuit 22 compresses the values L0 to L3 and then latches them. Thereafter, the ACS 21 supplies the compressed values L0 to L3 as standardized path metrics M0 to M3 one clock pulse prior to the ACS 21.

As an example of the compressing method, one g(for example, L0) of the latest standardized path metrics L0 to L3 is subtracted therefrom in the following manner.

$$M0 = L0 - L0 \tag{30}$$

$$M1 = L1 - L0 \tag{31}$$

$$M2 = L2 - L0 \tag{32}$$

$$M3 = L3 - L0 \tag{33}$$

As a result, M0 is always 0. However, in the following description, to keep the generality, M0 is represented as it is. The differences of the values M0 to M3 calculated by Formulas (30) to (33) are equal to the differences of the values L0 to L3. As described above, in the selection of the maximum likelihood status transition, only the differences of the values of the standardized path metrics are important. Thus, such a compressing method is effective for a method for compressing the values of the standardized path metrics without affecting the selected result of the maximum likelihood status transition and for preventing L0 to L3 from overflowing. In such a manner, the ACS 21 and the compression and latch circuit 22 compose a loop with respect to calculations of standardized path metrics.

Figure 11:
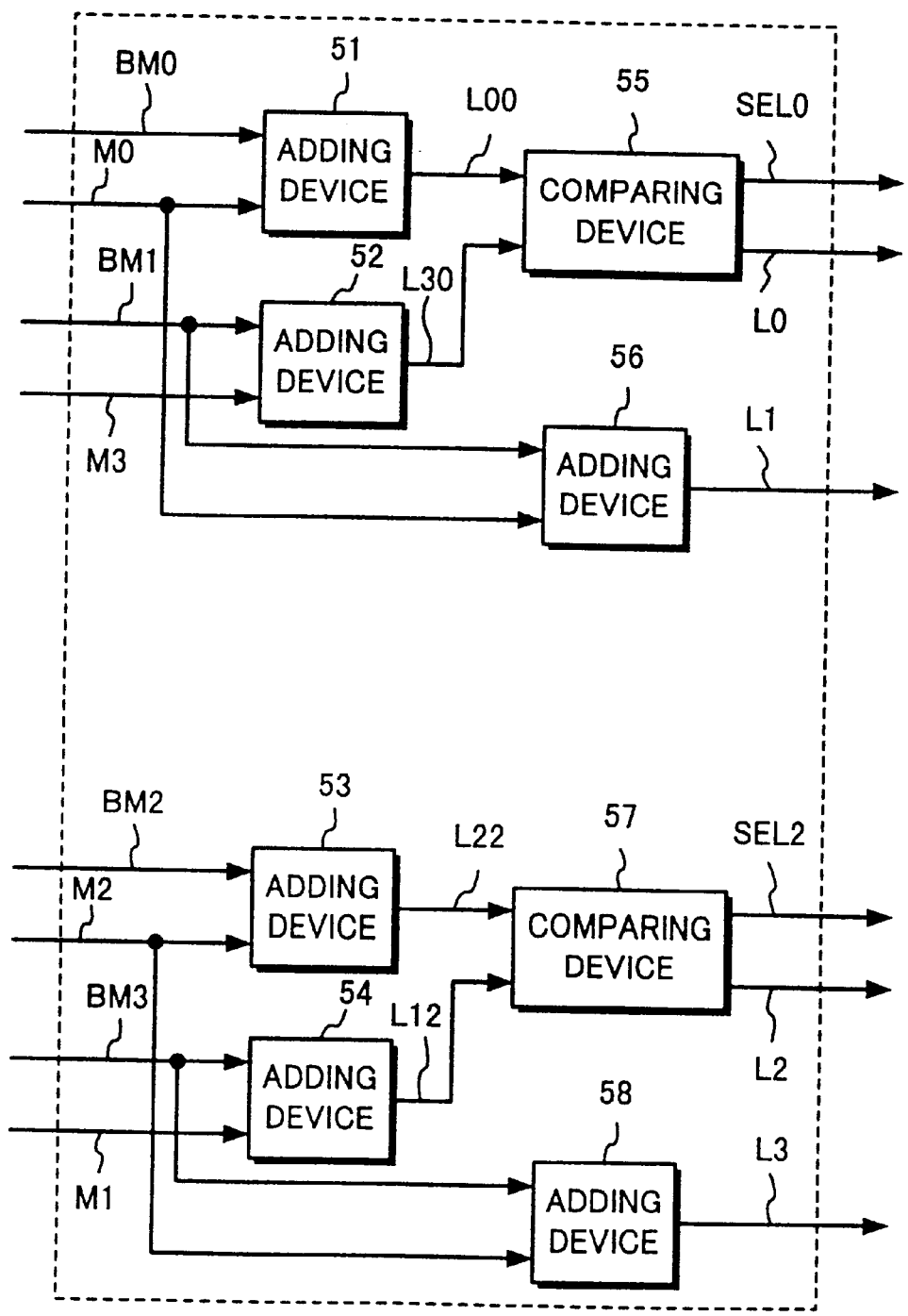
FIG. 11 is a block diagram showing the structure of a part of the Viterbi decoder shown in FIG. 10.

Next, with reference to FIG. 11, the ACS 21 will be described in detail. The ACS 21 is composed of six adding devices 51, 52, 53, 54, 56, and 58 and two comparing devices 55 and 57. On the other hand, values M0 to M3 of compressed standardized path metrics one clock pulse prior and values BM0 to BM3 of branch metrics corresponding thereto are supplied to the ACS 21.

The values M0 and BM0 are supplied to the adding device 51. The adding device 51 adds the values M0 and BM0 and outputs L00 that is expressed as follows.

$$L00 = M0 + BM0 \tag{34}$$

As described above, th value M0 is a compressed standardized path metric corresponding to the sum of status transitions in the status S0 at the time point k−1. The value BM0 is calculated with the reproduced signal z[k] at the time point k corresponding to Formula (26). The value BM0 is the value z[k]. Consequently, the value of Formula (34) is a calculated value of m(0, k−1)+z[k] (that has been compressed) in Formula (20). In other words, the value of Formula (34) is a calculated value in the case that the status S0 at the time point k−1 changes to the status S0 at the time point k by a status transition S0 →S0.

On the other hand, the values M3 and BM1 are supplied to the adding device 52. The adding device 52 adds the values M3 and BM1 and outputs L30 that is expressed as follows.

$$L30 = M3 + BM1 \tag{35}$$

As described above, the value M3 is a compressed standardized path metric corresponding to the sum of status transitions in the case that the status at the time point k−1 is S3. The value BM1 is calculated with the reproduced signal z[k] at the time point k corresponding to Formula (27). Thus, The value BM1 is expressed by $\alpha \times z[k] - \beta$. Consequently, the value of Formula (35) is a calculated value of m(3, k−1)+$\alpha \times z[k]$−$\beta$ (that has been compressed) in Formula (20). In other words, the value of Formula (35) is a calculated value in the case that the status S3 at the time point k−1 changes to the status S0 at the time point k by a status transition S3→S0.

The values L00 and L30 are supplied to the comparing device 55. The comparing device 55 compares the values L00 and L30 and treats the smaller value as the latest standardized path metric L0. In addition, corresponding to the selected result, as described above, the comparing device 55 changes the signal level of the selection signal SEL0. This structure corresponds to the selection of the minimum value in Formula (20). In other words, when L00<L30 (in this case, the status transition S0→S0 is selected), the comparing device 55 outputs the value L00 as the values L0 and causes the signal level of the selection signal SEL0 to be for example "Low". On the other hand, when L30<L00 (in this case, the status transition S3→S0 is selected), the comparing device 55 outputs the value L30 as the value L0 and causes the signal level of the selection signal SEL0 to be for example "High". As will be described later, the selection signal SEL0 is supplied to an A type path memory 24 (that will be described later) corresponding to the status S0.

As described above, the adding devices 51 and 52 and the comparing device 55 select the maximum likelihood status transition at the time point k from the status transitions S0→S0 and S3→S0 corresponding to Formula (20). Corresponding to the selected result, the comparing device 55 outputs the latest standardized path metric L0 and the selection signal SEL0.

The values M0 and BM1 are supplied to the adding device 56. The adding device 51 adds the values M0 and BM1 and outputs L1 expressed as follows.

$$L1 = M0 + BM1 \tag{36}$$

As described above, the value M0 is a compressed standardized path metric corresponding to the sum of the status transitions in the case that the status at the time point k−1 is S0. The value BM1 is calculated with the reproduced signal z[k] at the time point k corresponding to Formula (27). Namely, the value BM1 is expressed by $\alpha \times z[k] - \beta$. Thus, the value of Formula (36) is a calculated value of the right side $m(0, k-1) + \alpha \times z[k] - \beta$ (that has been compressed) in Formula (21). In other words, the value of Formula (36) is a calculated value in the case that the status S0 at the time point k−1 changes to the status S1 at the time point k by a status transition S0 →S1. In Formula (21), a value is not selected. Thus, the output data of the adding device 56 is the latest standardized path metric L1.

The values M2 and BM2 are supplied to the adding device 53. The adding device 53 adds the values M2 and BM2 and outputs L22 expressed as follows.

$$L22 = M2 + BM2 \tag{37}$$

As described above, the value M2 is a compressed standardized path metric corresponding to the sum of status transitions in the case that the status at the time point k−1 is S2. The value BM0 is calculated with the reproduced signal z[k] at the time point k corresponding to Formula (28). In other words, the value BM0 is −z[k]. Thus, the value of Formula (37) is a calculated value of $m(2, k-1) - z[k]$ (that has been compressed) in Formula (22). In other words, the value of Formula (37) is a calculated value in the case that the status S2 at the time point k changes to the status S2 by a status transition S2→S2.

On the other hand, the values M1 and BM3 are supplied to the adding device 54. The adding device 53 adds the values M1 and BM3 and outputs L12 expressed as follows.

$$L12 = M1 + BM3 \tag{38}$$

As described above, the value M1 is a compressed standardized path metric corresponding to the sum of status transitions in the case that the status at the time point k−1 is S1. The value BM3 is calculated with the reproduced signal z[k] at the time point k corresponding to Formula (29). In other words, the value BM3 is expressed by $-\alpha \times z[k] - \beta$. Thus, the value of Formula (38) is a calculated value of $m(1, k-1) - \alpha \times z[k] - \beta$ (that has been compressed) in Formula (22). In other words, the value of Formula (38) is a calculated value in the case that the status S1 at the time point k−1 changes to the status S2 at the time point k by a status transition S1→S2.

The values L22 and L12 are supplied to the comparing device 57. The comparing device 57 compares the values L2 and L12, treats the smaller value as the latest standardized path metric L2, and changes the signal level of the selection signal SEL2 corresponding to the selected result. This structure corresponds to the selection of the minimum value in Equation (22). In other words, when L22<L12 (in this case, the status transition S2→S2 is selected), the comparing device 57 outputs the value L22 as L2 and causes the signal level of the selection signal SEL2 to be for example "Low". On the other hand, when L12<L22 (in this case, the status transition S1→S2 is selected), the comparing device 57 outputs the value L12 as L2 and causes the signal level of the selection signal SEL2 to be for example "High". As will be described later, the selection signal SEL2 is supplied to an A type path memory 26 that corresponds to the status S2.

The adding devices 53 and 54 and the comparing device 57 select the maximum likelihood status transition at the time period k from the status transitions S1→S2 and S2→S2 corresponding to Formula (22). The comparing device 57 outputs the latest standardized path metric L2 and the selection signal SEL2 corresponding to the selected result.

The values M2 and BM3 are supplied to the adding device 58. The adding device 58 adds the values M2 and BM3 and outputs L3 expressed as follows.

$$L3 = M2 + BM3 \tag{39}$$

As described above, the value M2 is a compressed standardized path metric corresponding to the sum of status transitions in the case that the status at the time point k−1 is S2. The value BM3 is calculated with the reproduced signal z[k] at the time point k corresponding to Formula (29). In other words, the value BM3 is expressed by $-\alpha \times z[k] - \beta$. Thus, the value of Formula (23) is a calculated value of the right side $m(2, k-1) + \alpha \times z[k] - \beta$ (that has been compressed) in Formula (23). In other words, the value of Formula (23) is a calculated value in the case that the status S0 at the time point k−1 changes to the status S3 at the time point k by a status transition S2 →S3. In Formula (23), a value is not selected. Thus, the output data of the adding device 58 is the latest standardized path metric L3.

As described above, since the path memory unit (PMU) 23 operates corresponding to the selection signals SEL0 and SEL2 received from the ACS 21, decoded data a'[k] as the maximum likelihood decoded data sequence according to the recorded data a[k] is generated. The PMU 23 is composed of two A type bus memories and two B type bus memories that correspond to status transitions of four status as shown in FIG. 7.

An A type path memory has two transitions to a particular status (namely, a transition from the particular status to the same status and a transition from another status to the particular transition). In addition, the A type path memory has a structure corresponding to two transitions starting from the particular status (namely, a transition from the particular status to the same status and a transition from the particular status to another status). Thus, the A type path memory corresponds to the two statuses S0 and S2 of the four statuses shown in FIG. 7.

On the other hand, a B type path memory has one transition to a particular status. In addition, the B type path memory has a structure corresponding to one transition starting from the particular status. Thus, the B type path memory corresponds to the status S1 or S3 of the four statuses shown in FIG. 7.

Figure 10:
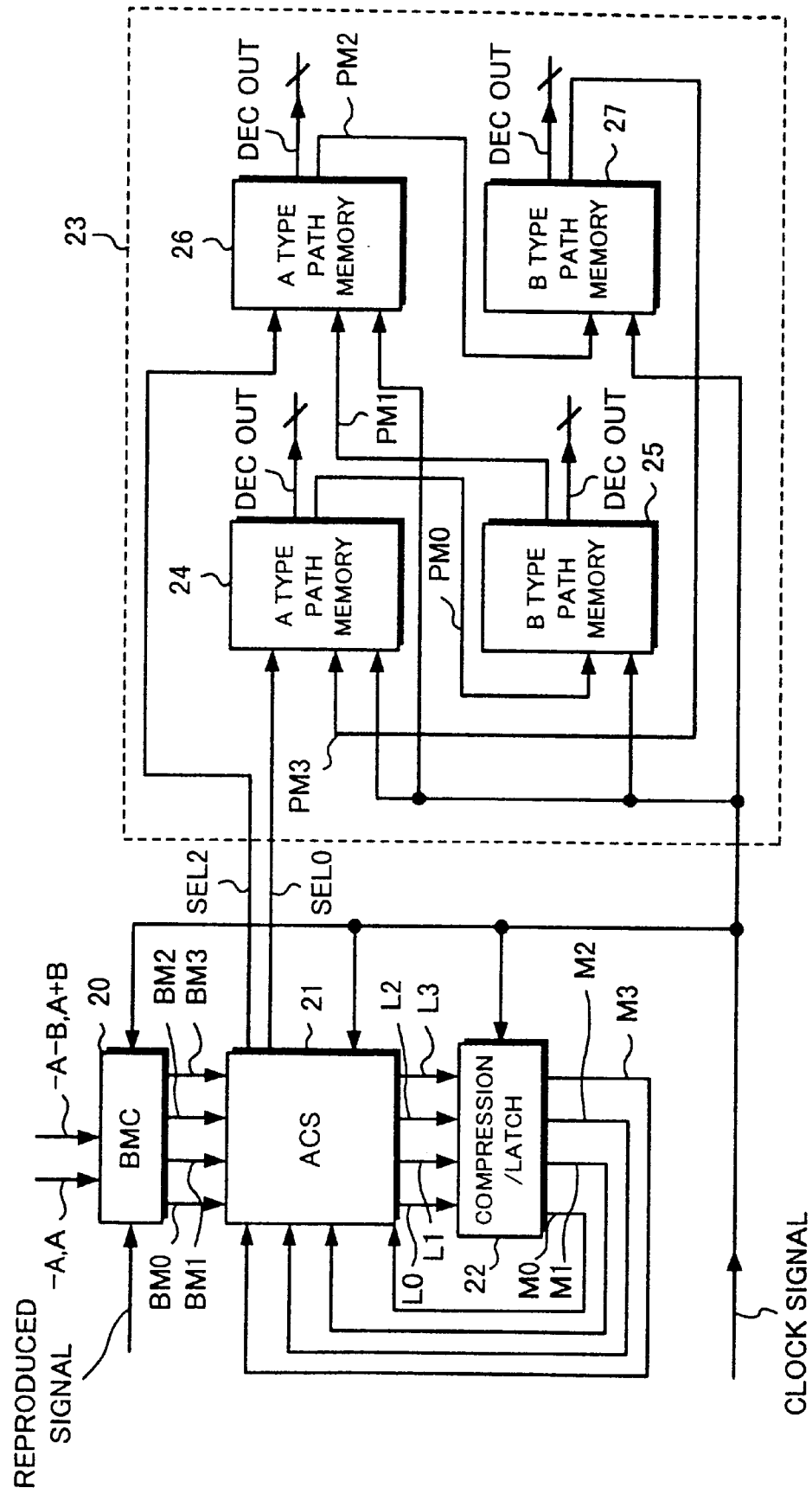
FIG. 10 is a block diagram showing the overall structure of a Viterbi decoder that performs the four-value four-status Viterbi decoding process.

The PMU 23 exchanges decoded data as shown in FIG. 10 so that the two A type path memories and the two B type path memories operate corresponding to the status transition diagram shown in FIG. 7. In other words, the A type path memories 24 and 26 correspond to the statuses S0 and S2, respectively. The B type path memories 25 and 27 correspond to the statuses S1 and S3, respectively. Thus, the status transitions starting from S0 are S0→S0 and S0→S1. The status transitions starting from S2 are S2→S2 and S2→S3. In addition, the status transition starting from S1 is only S1→S2. The status transition starting from S3 is S3→S0.

Figure 12:
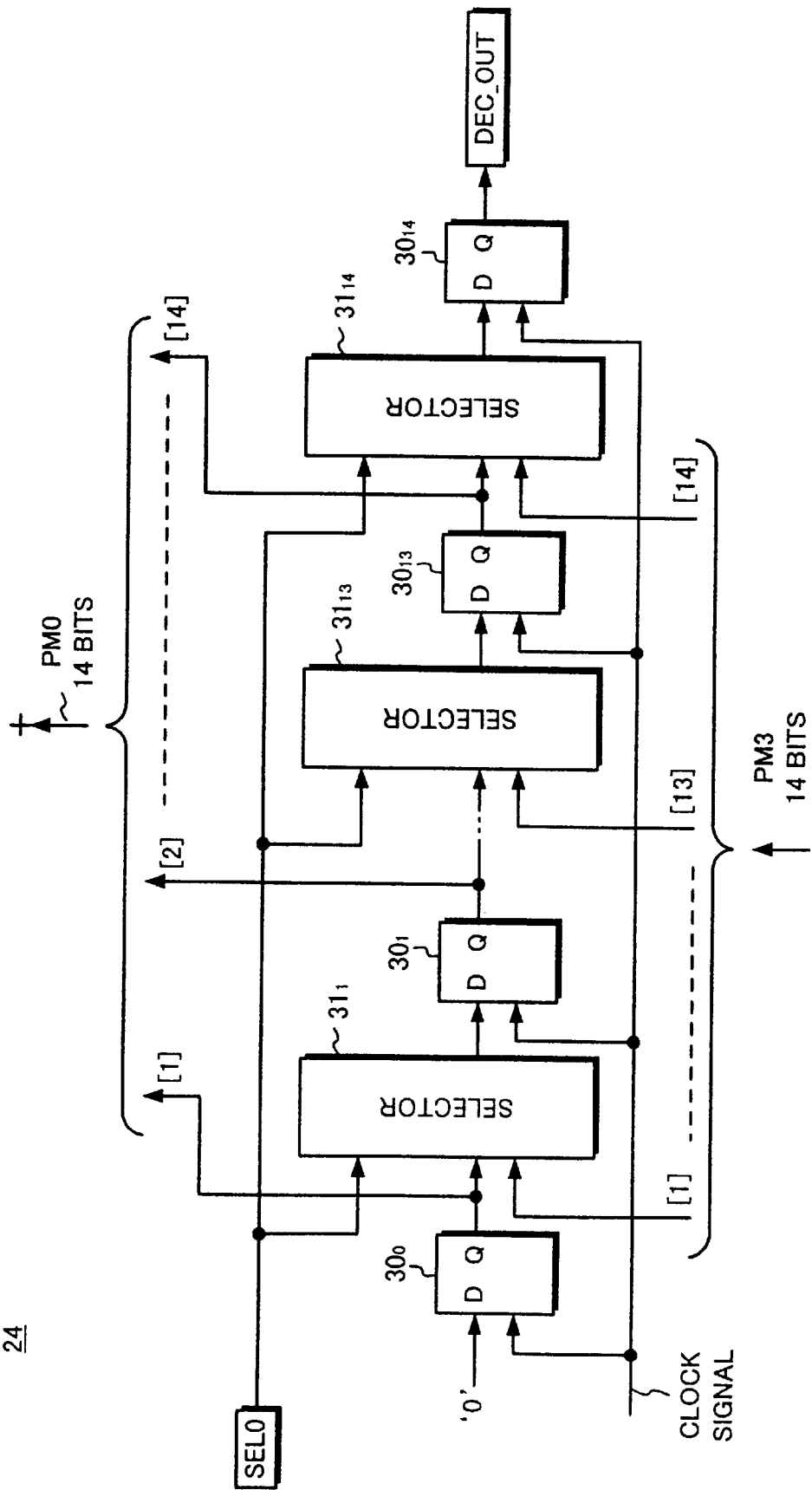
FIG. 12 is a block diagram showing the structure of another part of the Viterbi decoder shown in FIG. 10.

FIG. 12 shows the detailed structure of the A type path memory 24. The A type path memory 24 is composed of flip-flops and selectors that are alternately disposed corresponding to the length of the path memory. The structure shown in FIG. 12 has a decoded data length of 14 bits. In other words, the A bus memory 24 has 14 selectors $31_1$ to $31_{14}$ and 15 flip-flops $30_0$ to $30_{14}$. The selectors $31_1$ to $31_{14}$ each receive two data values and selectively supplies one of them to the next stage. In addition, clock pulses are supplied to the flip-flops $30_0$ to $30_{14}$ so as to match the operation timings of the structural portions of the A type path memory 24.

As was described in FIG. 7, transitions to the status S0 are S0→S0 (where the self status is taken over) and S3→S0. In the structure that corresponds to such a situation, each selector receives data from the flip-flop on the preceding stage (namely, decoded data corresponding to the status transition S0 →S0) and data received from the B type path memory 27 that corresponds to the status S3 (namely, decoded data PM3 corresponding to the status transition S3→S0). In addition, each selector receives the selection signal SEL0 from the ACS 21. Each selector supplies one of two decoded data values to the flip-flop on the next stage corresponding to the signal level of the selection signal SEL0. The decoded data value that is supplied to the flip-flop on the next stage is also supplied as PM0 to the B type path memory 25 that corresponds to the status S1.

In other words, the selector $31_{14}$ receives a data value from the flip-flop $30_{13}$ on the preceding stage and the 14-th bit of the decoded data value PM3 from the B type path memory 27. The selected data value is supplied to the flip-flop $30_{14}$ on the next stage. As described above, corresponding to the selected result, the signal level of the selection signal SEL0 is set to "Low" or "High". When the signal level of the selection signal SEL0 is for example "Low", a data value received from the flip-flop. $30_{13}$ on the preceding stage is selected. When the signal level of the selection signal SEL0 is for example "High", the 14-th bit of the decoded data value PM3 is selected. The selected data value is supplied to the flip-flop $30_{14}$ on the next stage. The 14-th bit of the decoded data value PM0 is supplied to the B type path memory 25 that corresponds to the status S1.

The other selectors $3_1$ to $31_{13}$ of the A type path memory 24 operate as with the selector $31_{14}$ corresponding to the signal level of the signal level SEL0. Thus, when the selection signal SEL0 is for example "Low", the A type path memory 24 perform a serial shifting operation of which each flip-flop takes over data of the flip-flop on the preceding stage. On the other hand, when the signal level of the selection signal SEL0 is "High", the A type path memory performs a parallel loading operation of which each flip-flop takes over the decoded data value PM3 of 14 bits received from the B type path memory 27. In any case, the decoded data value that is taken over is supplied as the decoded data value PM0 of 14 bits to the B type path memory 25.

"0" is always supplied to the flip-flop $30_0$ on the first stage in synchronization with the clock signal. In each of the status transitions S0→S0 and S2→S0, as shown in FIG. 7, since the decoded data value is "0", the latest decoded data value is always "0".

As described above, the structure of the A type path memory 26 that corresponds to S2 is the same as the structure of the A type path memory 24. However, the A type path memory 26 receives the selection signal from the ACS 21. In addition, as shown in FIG. 7, there are two transitions S2→S2 (where the self status is taken over) and S1→S2. Thus, the B type path memory 25 that corresponds to the status S1 supplies the decoded value PM1 to the A type path memory 26. In addition, since the status transitions starting from S2 are S2 and S3, the A type path memory 26 supplies the decoded data value PM2 to the B type pass memory 27 that corresponds to the status S3.

"0" is always supplied to the flip-flop on the first stage of the A type path memory 26 that corresponds to the status S2 in synchronization with the clock signal. This operation in each of the status transitions S2→S2 and S1→S2 corresponds to the situation that since the decoded data value is "0", the latest decoded data value is always "0".

Figure 13:
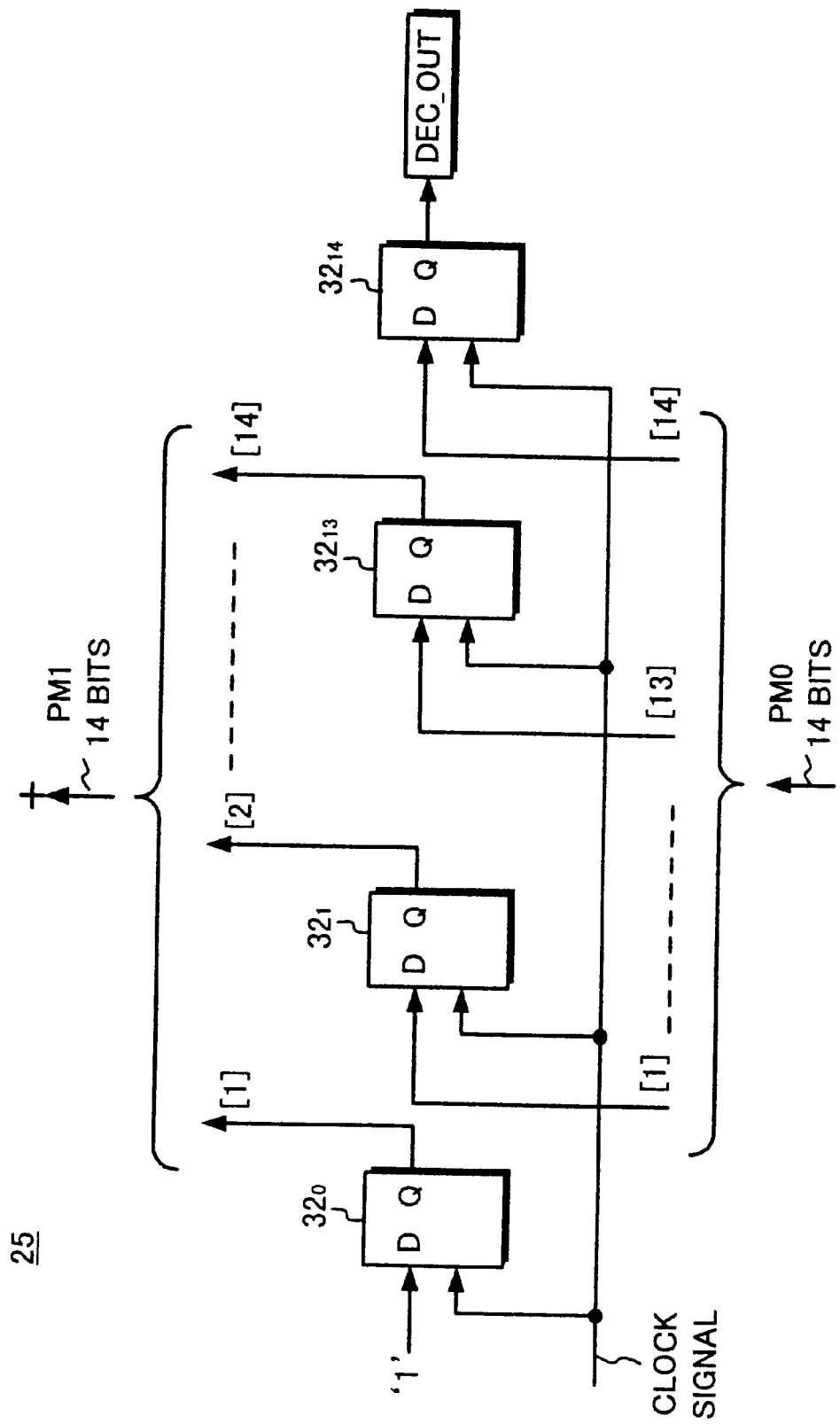
FIG. 13 is a block diagram showing the structure of a further other part of the Viterbi decoder shown in FIG. 10.

FIG. 13 shows the detailed structure of the B type path memory 25. The B type path memory 25 is composed of flip-flops corresponding to the length of the path memory. FIG. 13 shows a structure corresponding to a decoded data length of 14 bits. In other words, the B type path memory 25 has 15 flip-flops $32_0$ to $32_{14}$. Clock pulses are supplied to the flip-flops $32_0$ to $32_{14}$ so as to match the operation timings of the structural portions of the B type path memory 25.

The A type path memory 24 that correspond to the status S0 supplies a decoded data value of 14 bits as PM0 to the flip-flops $32_1$ to $32_{14}$. For example, the first bit of the decoded data value PM0 is supplied to the flip-flop $32_1$. Each of the flip-flops $31_1$ to $32_{14}$ stores the received value for the period of one clock pulse and supplies the stored value as a decoded data value PM1 of 14 bits to the A type path memory 26 that corresponds to the status S2. For example, the flip-flop 321 outputs the second bit of the decoded data value PM1.

The other flip-flops $32_0$ to $32_{13}$ of the B type path memory 25 operate as with the flip-flop $32_1$. Thus, the B type path memory 25 receives the decoded data value PM0 of 14 bits from the A type path memory 24 and supplies the decoded data value PM1 of 14 bits to the A type path memory 26.

"1" is always supplied to the flip-flop $32_0$ in synchronization with the clock signal. This operation corresponds to the situation that when the latest status transition is S0→S1, the decoded data value is "1".

As described above, the structure of the B type path memory 27 that corresponds to the status S3 is the same as the structure of the B type path memory 25. However, as shown in FIG. 7, since the status transition to the status S3 is S2→S3, the decoded data value PM2 is supplied from the A type path memory 26 that corresponds to the status S2 to the B type path memory 27. In addition, since the status starting from the status S3 is S0, the decoded data value PM3 is supplied to the A type path memory 24 that corresponds to the status S0. In the B type path memory 27, "1" is always supplied to the flip-flop on the last stage in synchronization with the clock signal. This operation corresponds to the situation that when the latest status transition is S2→S3, the decoded data is "1" as shown in FIG. 7.

As described above, the four path memories of the PMU 23 respectively generate decoded data values. The four decoded data values are always the same when the Viterbi decoding process is accurately performed. In the real Viterbi decoding process, mismatches takes place in the four decoded data values. This situation takes place due to noise in a reproduced signal. Thus, when the identification points A and B are detected, an error takes place and thereby the Viterbi decoding process becomes inaccurate.

Generally, the probability of which the four decoded data values do not match can be lowered when the number of stages of path memories is increased. In other words, when the quality such as C/N of the reproduced signal is high, even if the number of stages of path memories is relatively small, the probability of which the four decoded data values do not match is low. On the other hand, when the quality of a reproduced signal is not high, to lower the probability of which the four decoded data values do not match, it is necessary to increase the number of stages of path memories. When the number of stages of path memories is relatively small and thereby the probability of which the four decoded data values do not match cannot be sufficiently lowered, a structure (not shown) for selecting a proper decoded data value corresponding to the rule of majority is disposed downstream of the four path memories of the PMU 23.

[Viterbi Decoding Method Other than Four-value Four-status Viterbi Decoding Method]

The above-described four-value four-status Viterbi decoding method is applied to the case that the waveform equalizing characteristic of the filter portion 11 is PR(1, 2, 1) and that RLL(1, 7) code is used for recorded data. In the conditions that the record linear density is 0.40 μm, that the laser wavelength is 685 nm, and that NA is 0.55, with a waveform equalizing characteristic PR(1, 2, 1), the four-value four-status Viterbi decoding method can be optimally used. However, another Viterbi decoding method may be used corresponding to the waveform equalizing characteristic or an encoding method for generating recorded data.

For example, in the case that the waveform equalizing characteristic is PR(1, 1) and that an RLL(1, 7) code is used for recorded data, three-value four-status Viterbi decoding method is used. On the other hand, in the case that the waveform equalizing characteristic is PR(1, 3, 3, 1) and that an RLL(1, 7) code is used for recorded data, seven-value six-status Viterbi decoding method is used. A proper Viterbi decoding method is selected from such methods corresponding to a waveform equalizing characteristic that is properly adapted to an inter-code interference of a reproduced signal. Thus, an optimum Viterbi decoding method is selected corresponding to a record linear density and MTF.

The values of identification points may deviate from theoretical values due to a deviation of a waveform equalizing characteristic, an amplitude fluctuation of a reproduced signal, an asymmetrical distortion, and so forth. In consideration of such situations, a relevant Viterbi decoding method may be modified. For example, in the four-value four-status Viterbi decoding method, since it is difficult to accurately accomplish the waveform equalizing characteristic PR(1, 2, 1), six-value four-status Viterbi decoding method using six identification points may be used.

The present invention can be applied to the above-described magneto-optic disc apparatus. In other words, according to the present invention, a method for designating initial values of amplitude reference values is selected when the amplitude reference values are updated in individual status transitions based on the operation of the Viterbi decoder corresponding to read clock pulses and adapted to reproduced signals.

In addition, according to the present invention, in such a situation, the availability of the adapting process of an amplitude reference value is selected corresponding to a process performed corresponding to a reproduced result. According to the present invention, different amplitude reference values are adapted to signals reproduced from two areas on a record medium.

To update amplitude reference values corresponding to status transitions selected by the Viterbi decoder, data values that represent status transitions rather than decoded data values as a decoded data sequence corresponding to the status transitions. Thus, in the Viterbi decoder according to the embodiment of the present invention, status data values that represent statuses are used instead of decoded data values so as to generate status data values that represent selected status transitions. Thus, instead of the path metric unit PMU of the above-described magneto-optic disc unit, the status memory unit (SMU) that generates a sequence of status data values (that will be described later) is used.

For example, when four statuses are used as in the four-value four-status Viterbi decoding method or the like, since the four statuses can be expressed with two bits, the two-bit data values can be used as status data values. Thus, the statuses S0, S1, S2, and S3 shown in FIG. 7 can be expressed with two-bit status data values 00, 01, 11, and 10. Thus, in the following description, the statuses S0, S1, S2, and S3 shown in FIG. 7 are denoted by S00, S01, S11, and S10, respectively.

In addition, in the sector format of for example a magneto-optic disc, as the two types of areas, an address portion and a data portion are disposed. The address portion is an embossed region that stores information of the address of a relevant sector and so forth. In the sector format shown in FIGS. 3A to 3C, the header is an address portion. The data portion is an area in which user data and so forth are magneto-optically recorded. In the sector format shown in FIGS. 3A to 3C, the data portion is preceded by the ALPC and gap area preceded by the header.

A signal reproduced from the address portion is different from a signal reproduced from the data portion in a signal quality such as C/N. Generally, the C/N of a signal reproduced from the address portion is high, whereas the C/N of a signal reproduced from the data portion is low.

In the following description, as a waveform equalizing characteristic, PR($\alpha$, $\beta$, $\gamma$) is used instead of PR(B, 2A, B). This is because since it is difficult to obtain an ideal partial response characteristic in the real magneto-optic disc apparatus and so forth, a waveform equalizing characteristic of a signal received from the address portion is asymmetrical to a waveform equalizing characteristic of a signal received from the data portion.

As causes of the difficulty of the accomplishment of an ideal partial response, there are for example a limitation of the operation accuracy of a waveform equalizer, asymmetrical waveforms due to too large/small laser power in recording operation, and a phase error of read clock pulses with which an A/D converter samples a reproduced signal.

As with the above-described four-value four-status Viterbi decoding method, when data is recorded, an encoding process with RLmin=2 such as an RLL(1, 7) code is performed. When the partial response characteristic in the reproducing operation is PR($\alpha$, $\beta$, $\gamma$), six values and four statuses take place. In other words, reproduced signal values c[j+1] that have been waveform-equalized in the noise-free ideal case have different values of $2^3-2=6$ sets of {b[j-1], b[j], b[j+1]} other than two statuses of RLmin=2.

Figure 14:
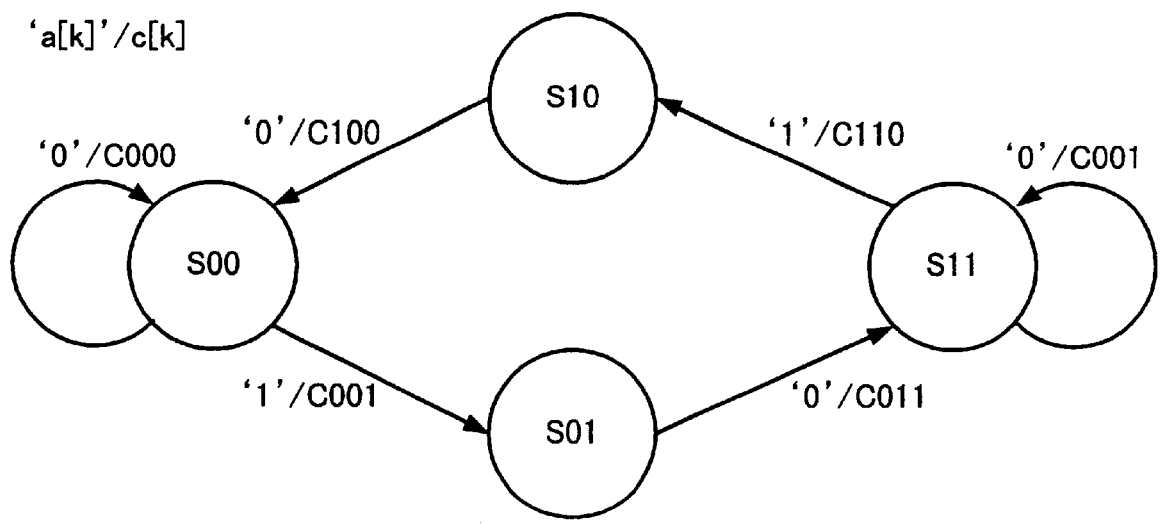
FIG. 14 is a schematic diagram showing an example of a status transition diagram of a six-value four-status Viterbi decoding method.

The values of such six identification points are denoted by cpqr where p, q, and r represent b[j-1], b[j], and b[j+1]. FIG. 14 shows the relation between the values of identification points and status transitions. Since RLmin 2, it should be noted that c010 and c101 are absent. In the following description, six values and four status corresponding to the status transition diagram shown in FIG. 14 will be considered.

Figure 15:
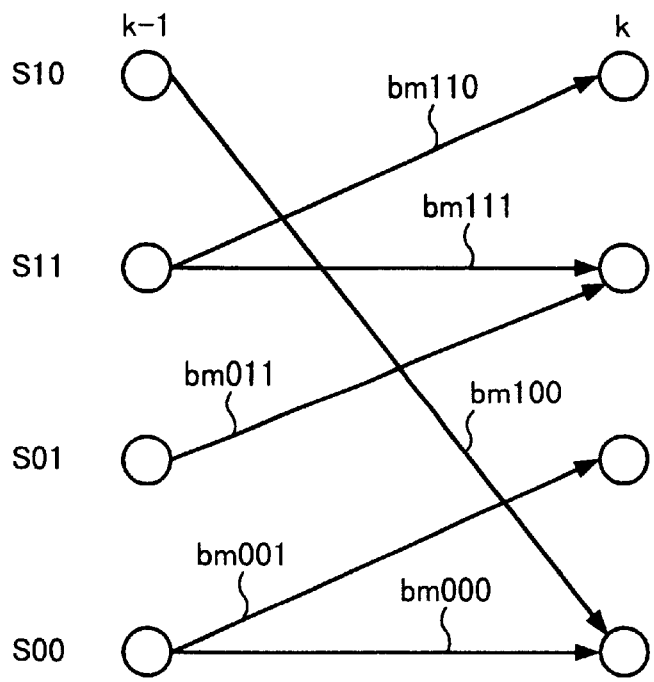
FIG. 15 is a schematic diagram for explaining a denoting method of branch metrics.

Branch metrics calculated corresponding to the six status transitions shown in FIG. 14 are denoted as follows. A status before a transition is represented by two bits. Likewise, a status after a transition is represented by two bits. By adding these two status values, a sequence of four bits is obtained. The second and third bits are represented by one bit. With the resultant three bits, a branch metric that takes place at one read clock period is represented. For example, a branch metric corresponding to a status transition S11→s10 is denoted by bm110. In such a manner, branch metrics corresponding to six status transitions shown in FIG. 14 can be represented as shown in FIG. 15.

Branch metrics defined as Euclidean distances of really reproduced signal values z[k] sampled by the A/D converter corresponding to read clock pulses and the values of the identification point points are calculated as follows.

$$bm000 = (z[k] - c000)^2 \quad (40)$$

$$bm001 = (z[k] - c001)^2 \quad (41)$$

$$bm011 = (z[k] - c011)^2 \quad (42)$$

$$bm111 = (z[k] - c111)^2 \quad (43)$$

$$bm110 = (z[k] - c110)^2 \quad (44)$$

$$bm100 = (z[k] - c100)^2 \quad (45)$$

When branch metrics are calculated in such a manner, the values of the identification points are treated as amplitude reference values. When standardized path metrics are used for preventing square calculations, branch metrics corresponding to the standardized path metrics are not calculated corresponding to Formulas (40) to (45). In this case, although the values of the identification points cannot be used as the amplitude reference values, the present invention can be applied.

With the values of the branch metrics, the path metric mij[k] of the status Sij at the time point k is calculated as follows. These formulas correspond to Formulas (15) to (18) of the four-value four-statuses Viterbi decoding method.

$$m10[k] = m11[k-1] + bm110 \quad (46)$$

$$m11[k] = \min\{m11[k-1] + bm111, m01[k-1] + bm011\} \quad (47)$$

$$m01[k] = m00[k-1] + bm001 \quad (48)$$

$$m00[k] = \min\{m00[k-1] + bm000, m10[k-1] + bm100\} \quad (49)$$

Figure 16:
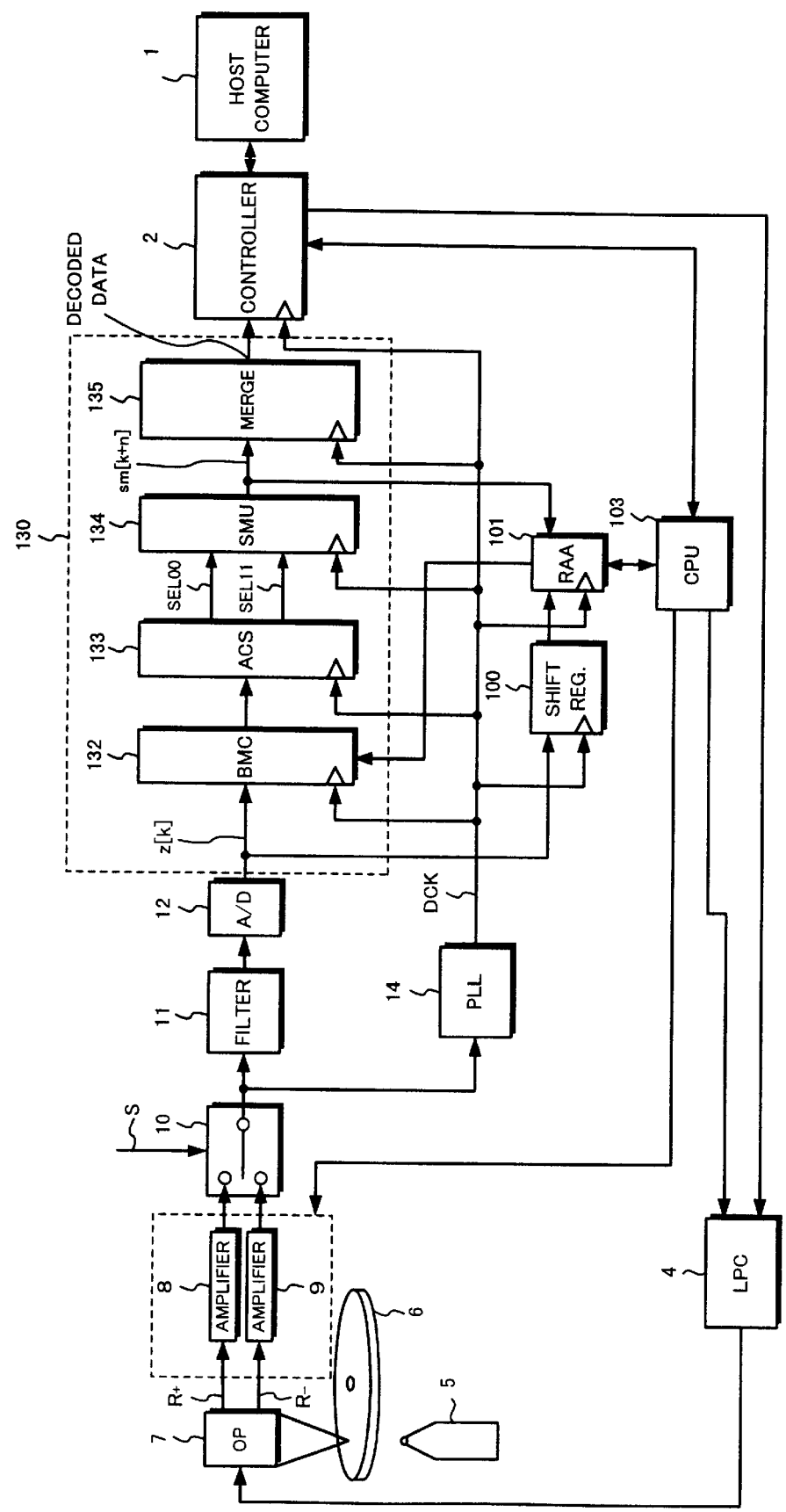
FIG. 16 is a block diagram showing the overall structure of an embodiment of the present invention.

FIG. 16 is a block diagram showing the overall structure of a magneto-opto disc apparatus according to an embodiment of the present invention. For simplicity, in FIG. 16, similar portions to those in FIG. 1 are denoted by similar reference numerals. The structure of a servo system that is not shown in FIG. 16 is the same as that in FIG. 1.

The structure of a recording system shown in FIG. 16 is the same as that shown in FIG. 1. In FIG. 16, a signal for controlling laser power is supplied from an apparatus controlling portion (CPU) to an LPC 4. The CPU 103 has a function for controlling operation parameters of structural portions of the recording system and the reproducing system as with the magneto-optic disc apparatus shown in FIG. 1. The CPU 103 supplies a gain control signal to amplifiers 8 and 9 of the reproducing system.

Next, the reproducing system of the magneto-optic disc apparatus will be described. The structure and operation of a circuit block ranging from an optical pickup 7 to an A/D converter 12 are the same as those in FIG. 1. However, in the apparatus shown in FIG. 16, an output signal of the A/D converter 12 is supplied to a Viterbi decoder 13 and a shift register 100. In addition, the structure and operation of a PLL 14 (that generates read clock pulses) shown in FIG. 16 are the same as those shown in FIG. 1.

The Viterbi decoder 130 selects the maximum likelihood status transition corresponding to a reproduced signal value z[k] received from the A/D converter 12 and generates a status data value that represents the selected status transition. The status data value is supplied to an amplitude reference value adapting block (RAA) 101. The Viterbi decoder 130 generates decoded data corresponding to the status data value and supplies the decoded data to a controller 2.

On the other hand, the shift register 100 delays the received reproduced signal value z[k] for a predetermined time period and supplies the resultant signal value to the RAA 101. This is because the status data value generated by the Viterbi decoder 130 delays the reproduced signal value z[k] by the period for n read clock pulses. The status data value generated by the SMU 134 is denoted by sm[k+n] due to the delay time period.

The RAA 101 updates an amplitude reference value with the status data value sm[k+n] and the delayed reproduced signal value at each time point corresponding to each clock pulse as will be described later. The updated amplitude reference value is supplied to a BMC 132 of the Viterbi decoder 130.

Next, the Viterbi decoder 130 that performs the Viterbi decoding process will be described in detail. The Viterbi decoder 130 is composed of a BMC 132, an ACS 133, an SMU 134, and a merge block 135. The read clock pulses DCK (hereinafter, simply referred to as clock pulses) are supplied from the PLL 14 to these structural elements so as to match the operation timings thereof.

The BMC 132 calculates the values of the branch metrics bm000 to bm111 with amplitude reference values received from the RAA 101 and the reproduced signal value z[k] corresponding to Formulas (40) to (45) and supplies the calculated values to the ACS 133.

The ACS 133 calculates values of path metrics with the received values of branch metrics corresponding to Formulas (46) to (49), compares the calculated values, and selects the maximum likelihood status transition. The ACS 133 supplies selection signals SEL00 and SEL11 to the SMU 134.

Next, the SMU 134 will be described. The PMU 23 of the magneto-optic disc apparatus shown in FIG. 1 processes a decoded data value bit by bit. On the other hand, the SMU 134 processes a status data value two bits by two bits. Thus, the SMU 134 generates status data values as a sequence of status data values sm[k+n].

Figure 17:
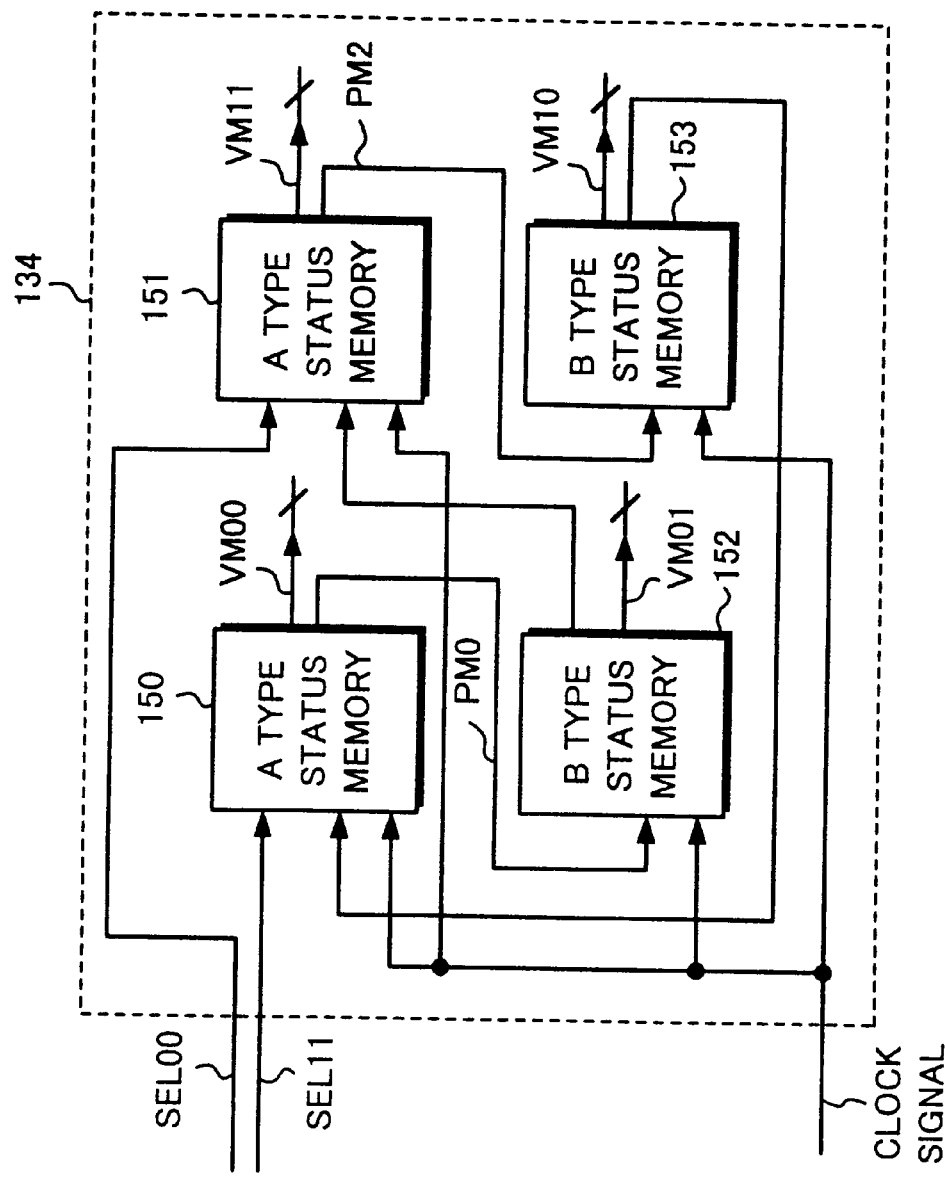
FIG. 17 is a block diagram showing an example of the structure of a status memory unit (SMU) according to an embodiment of the present invention.

As shown in FIG. 17, the SMU 134 has two A type status memories 150 and 151 and two B type status memories 152 and 153. In the SMU 134, signal lines for supplying selection signals SEL00 and SEL11, a clock signal, and status data are connected among the status memories. The A type status memories 150 and 151 correspond to statuses S00 and S11, respectively. The B type status memories 152 and 153 correspond to statuses S01 and S10, respectively. The four status memories are mutually connected corresponding to the status transition diagram shown in FIG. 14.

Figure 18:
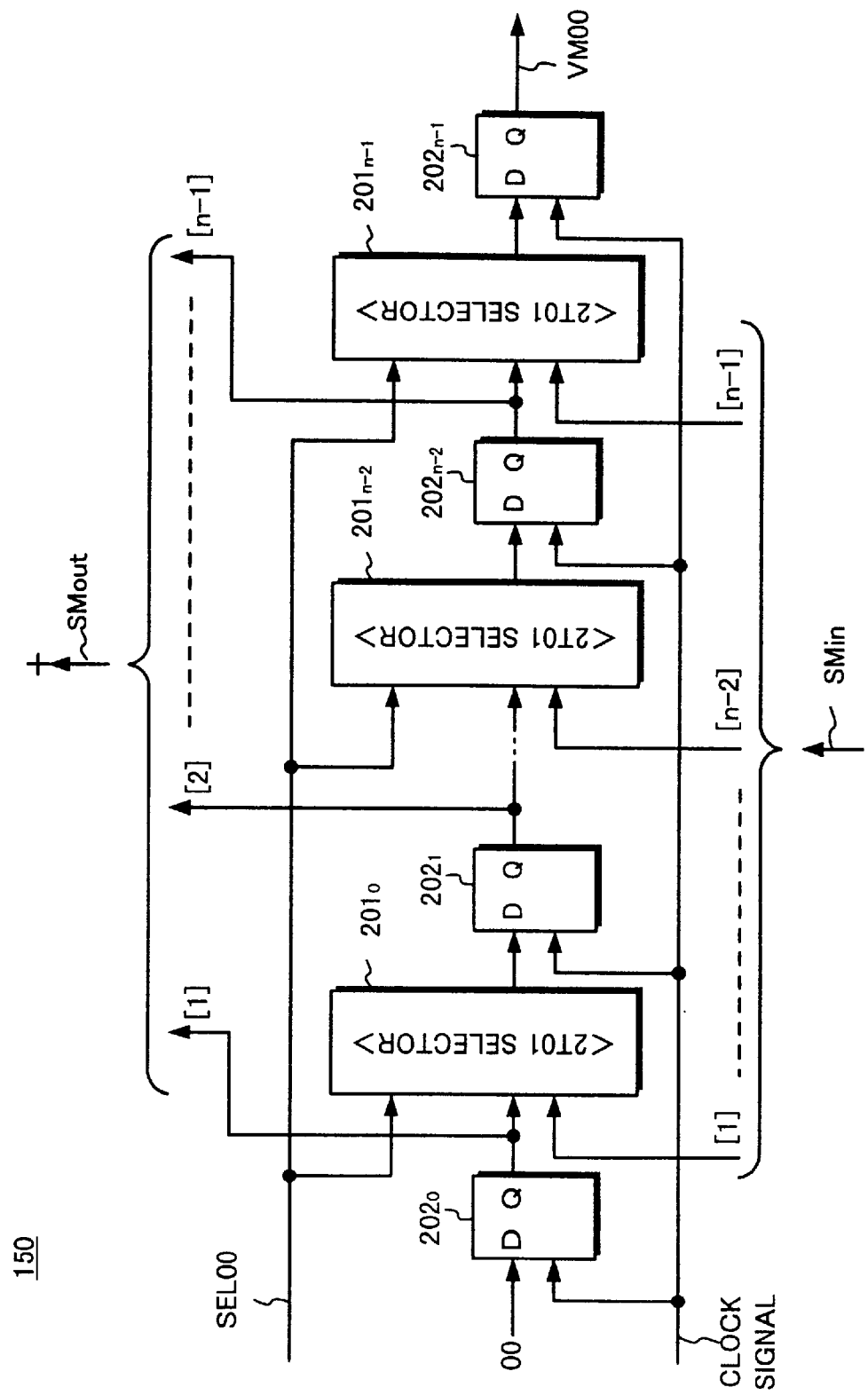
FIG. 18 is a block diagram for explaining the structure of a part of an SMU shown in FIG. 17.

Next, with reference to FIG. 18, the A type status memory 150 corresponding to the status S00 will be described. The A type status memory 150 has n processing stages. In other words, the A type status memory 150 has n selectors $201_0 \ldots 201_{n-1}$ and n registers $202_0 \ldots 202_{n-1}$ that are alternately connected. The selection signal SEL00 is supplied to the selectors $201_0$ to $201_{n-1}$. As described above, status data that is taken over from the B type status memory 153 that corresponds to the status S10 is supplied as SMin of n bits to each selector. Status data that is taken over to the B type status memory 152 that corresponds to the status S01 is output as SMout composed of (n−1) status data values to each register. In addition, clock pulses are supplied to the registers $202_0$ to $202_{n-1}$.

Next, the operation of each selector will be described. As shown in FIG. 14, statuses that change to the status S00 (namely, statuses one clock pulse prior) are S00 and S10. When a status one clock pulse prior is S00, a status transition where the self status is taken over takes place. Thus, "00" is input as the latest status data value of the status data values (as the serial shifting operation) to the selector $201_0$ on the first stage. In addition, the latest status data value SMin[1] of the status data values received from the B type status memory 153 is supplied as the parallel loading operation to the selector $201_0$. The selector $201_0$ supplies one of the two status data values to the register $202_0$ on the next stage corresponding to the selection signal SEL00.

Each of the selectors $201_1$ to $201_{n-1}$ on the second or later stages receives one status data value from the B type status memory 153 that corresponds to the status S10 as the parallel loading operation and one status data value from the register on the preceding stage as the serial shifting operation. Each of the selectors $201_1$ to $201_{n-1}$ supplies a status data value that is determined as the maximum likelihood corresponding to the selection signal SEL00 to the register on the next stage. Since all the selectors $201_0$ to $201_{n-1}$ operate corresponding to the same selection signal SEL00, a status data value as the maximum likelihood status data value selected by the ACS 133 is taken over.

In addition, the registers $202_0$ to $202_{n-1}$ store the supplied status data values corresponding to the clock pulses and update the stored status data values. Output data values of the individual registers are supplied to status memories corresponding to statuses that are changed one clock pulse later. In other words, since the status changes to S00, output data values of the relevant registers are supplied to the relevant selector on the next stage as the serial shifting operation. In addition, the output data values of the relevant registers are supplied as the parallel loading operation to the B type status memory 152 that corresponds to S01. The register $202_{n-1}$ on the last stage outputs a status data value VM00. Thus, the status data value VM00 is output from the status memory corresponding to the clock pulses.

The structure of the A type status memory 151 that corresponds to the status S11 is the same as the structure of the A type status memory 150. However, a status data value is supplied from the B type status memory 152 that corresponds to S01 to the A type status memory 151 as the parallel loading operation corresponding to the status transition S01→S11 shown in FIG. 14. In addition, a status data value is supplied from the A type status memory 151 to the B type status memory 153 that corresponds to S10 as the parallel loading operation corresponding to the status transition S11→S10 shown in FIG. 14.

Figure 19:
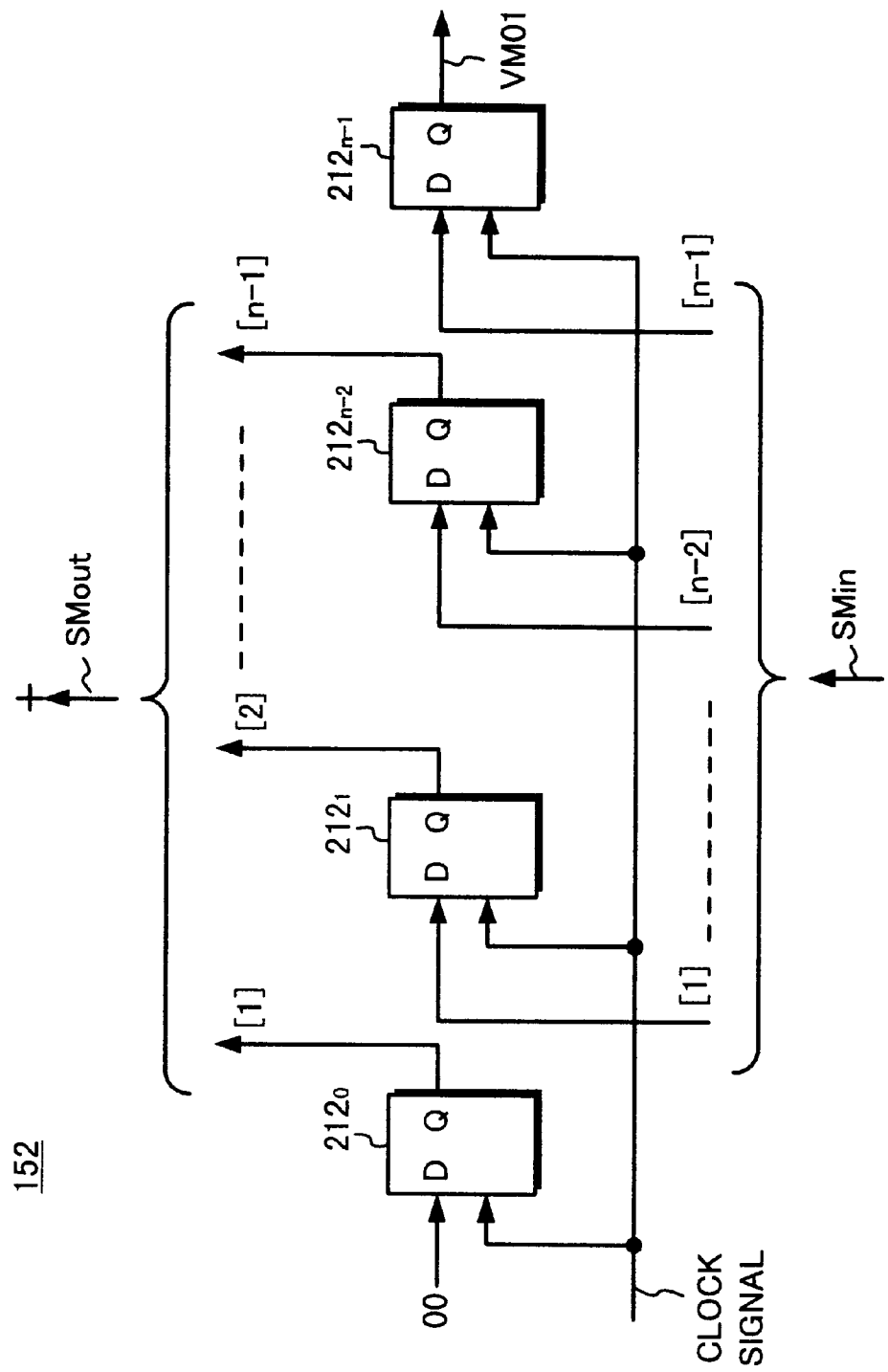
FIG. 19 is a block diagram for explaining the structure of another part of the SMU shown in FIG. 17.

Next, with reference to FIG. 19, the B type status memory 152 that corresponds to the status S01 will be described. The B type status memory 152 corresponds to a status that does not take over the self status and that has one status transition one clock pulse later. Thus, the B type status memory 152 neither performs the serial shifting operation, nor has selectors. In other words, the B type status memory 152 is composed of n registers $212_0$, $212_1$ ... $212_{n-1}$. The clock pulses are supplied to the n registers $212_0$, $212_1$, ... $212_{n-1}$ so as to match the operation timings thereof.

Status data values that are taken over from the A type status memory 150 that corresponds to the status S00 are supplied as SMin composed of (n-1) status data values to the registers $212_0$, $212_1$, . . . , $212_{n-1}$. However, "00" is always input to the register $212_0$ on the first processing stage corresponding to clock pulses. This operation corresponds to the situation that the latest status transition that changes to S01 is always S00 as shown in FIG. 14. The registers $212_0$ to $212_{n-1}$ store status data values corresponding to the clock pulses and thereby update the stored status data values. In addition, output data values of the registers $212_0$ to $212_{n-1}$ are supplied as SMout composed of (n-1) status data values to the A type status memory 151 that corresponds to the status S11 that takes place one clock pulse later. The register $212_{n-1}$ on the last stage outputs a status data value VM01. Thus, the status data value VM01 is output from the status memory corresponding to the clock pulses.

The structure of the B type status memory 153 that corresponds to the status S10 is the same as that of the B type status memory 152. However, a status data value is supplied from the A type status memory 151 that corresponds to the status S11 to the B type status memory 153 as the parallel loading operation corresponding to the status transition S11→S10 shown in FIG. 14. In addition, a status data value is supplied from the B type status memory 153 to the A type status memory 150 that corresponds to the status S00 as the parallel loading operation corresponding to the status transition S10→S00 shown in FIG. 14. "11" is always input to the register on the first processing stage corresponding to the clock pulses. This operation corresponds to the situation that the status (one clock pulse prior) that can change to the status S10 is S11 as shown in FIG. 14.

In the Viterbi decoding method, when the memory length n of the status memories is sufficiently large, the status data values VM00, VM11, VM01, and VM10 generated by the status memories match. In this case, one of status data values generated by the four status memories may be output as sm[k+n] to the next stage. The memory length n is determined corresponding to the C/N of a reproduced signal, the frequency characteristic thereof, and so forth.

Next, the merge block 135 will be described. The merge block 135 stores a decoding matrix table shown in FIG. 20 in a means that is for example a ROM. With the decoding matrix table, the merge block 135 generates a decoded data value corresponding to a status data value and supplies the decoded data value to the controller 2. From the status transition diagram shown in FIG. 14, it is clear that a decoded data value corresponds to two successive status data values. In other words, a decoded data value at a time point k+n is obtained with a status data value sm[k+n] generated corresponding to the reproduced signal value z[k] and the status data value sm[k+n 1] generated corresponding to the reproduced signal value z[k-1] one clock pulse prior.

For example, when sm[k+n] is "01" and sm[k+n-1] is "00", as shown in FIG. 14, it is clear that the decoded data value is "1". Such a relation is tabulated as the decoding matrix table shown in FIG. 20.

On the other hand, as described above, the RAA 101 performs calculations for updating amplitude reference values with the status data values generated by the SMU 134 and the reproduced signal values z[k] delayed by the shift register 100 corresponding to clock pulses. Next, such calculations will be described.

Corresponding to the status transition diagram shown in FIG. 14, with a status data value sm[k+n] generated corresponding to a reproduced signal value z[k] and a status data value sm[k+n-1] generated one clock pulse prior, a status transition between the two status data values and an amplitude reference value corresponding thereto can be obtained. As will be described later, with the obtained amplitude reference value and the reproduced signal value z[k], a new amplitude reference value can be calculated.

Actually, amplitude reference values are calculated for the address portion and the data portion. Thus, in the six-value four-status Viterbi decoding method, 6×2=12 amplitude reference values are adapted.

Next, calculations of amplitude reference values are described in a real case of sm[k+n]="01" and sm[k+n-1]="11". In this case, FIG. 14 shows that a status transition S01→S11 takes place. In addition, it is clear that an amplitude reference value corresponding to the status transition is c011. Thus, the RAA 101 performs the following calculations for updating amplitude reference values.

$$Ac011\ (\text{new}) = \delta \times z[k] + (1-\delta) \times Ac011\ (\text{old}) \quad (50)$$

$$Dc011\ (\text{new}) = \delta \times z[k] + (1-\delta) \times Dc011\ (\text{old}) \quad (51)$$

where Ac011 (new) and Dc011 (new) are newly calculated values as amplitude reference values for the address portion and the data portion; and Ac011 (old) and Dc011 (old) are values that have not been updated for the address portion and the data portion.

Generally, when sm[k+n]=pq and sm[k+n−1]=qr, new amplitude reference values are calculated in the following manner.

$$Acpqr\ (\text{new}) = \delta \times z[k] + (1-\delta) \times Acpqr\ (\text{old}) \quad (52)$$

$$Dcpqr\ (\text{new}) = \delta \times z[k] + (1-\delta) \times Dcpqr\ (\text{old}) \quad (53)$$

where Acpqr (new) and Dcpqr (new) are newly calculated values as amplitude reference values for the address portion and the data portion, respectively; and Acpqr (old) and Dcpqr (old) are values that have not been updated for the address portion and the data portion, respectively. A matrix table shown in FIG. 22 represents the relation among MOGATE signal, status data values sm[k+n] and sm[k+n−1], and 12 amplitude reference values (Ac000 to Ac111 and Dc000 to Dc1110 to be updated). As will be described later, the RAA 101 operates corresponding to the matrix table shown in FIG. 22.

In Formulas (52) and (53), δ represents a correction coefficient. When the value of δ is designated, relatively continuous characteristics of recording system and reproducing system (such as the amplitude of a reproduced signal, the fluctuation thereof, distortion due to asymmetrical signals, an error of the operation of the waveform equalizer) and irregular characteristics due to a defect of a record medium.

In other words, as the value of δ is large, when amplitude reference values are updated corresponding to Formula (52) or (53), the resultant amplitude reference values are largely reflected by the fluctuation of the amplitude of the reproduced signals, asymmetrical signals, and error of the operation of the waveform equalizer. On the other hand, the amplitude reference values tend to be affected by an irregular signal due to a defect of a record medium. On the other hand, when the value of δ is small, the amplitude reference values are not largely affected by an irregular signal due to a defect of a record medium. However, since the amplitude reference values does not quickly follow a reproduced signal, the effect of the adapting process for amplitude reference values that are updated corresponding to Formula (52) or (53) deteriorates.

Next, with reference to FIG. 21, the structure of the RAA 101 that performs the adapting process for amplitude reference values will be described. As was described above, in the six-value four-status Viterbi decoding method, six amplitude reference values c000, c001, c011, c100, c110, and c111 are required. Since the six amplitude reference values are adapted for each of the address portion and the data portion, 6×2×12 registers are disposed.

Figure 21:
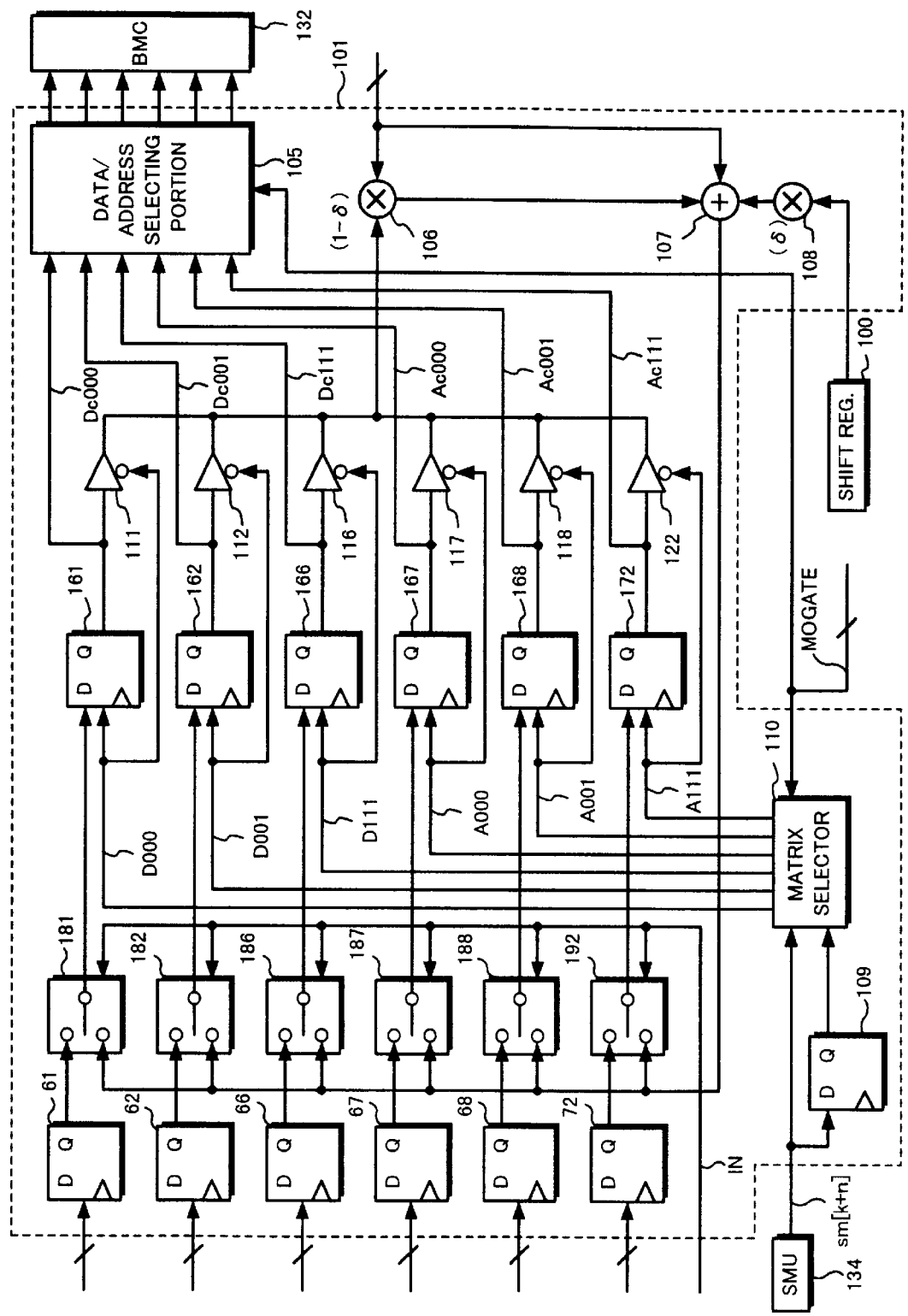
FIG. 21 is a block diagram for explaining an example of the structure of an amplitude reference value adapting block (RAA) according to an embodiment of the present invention.

In FIG. 21, registers 161, 162, 163, 164, 165, and 166 correspond to six amplitude reference values Ac000, Ac001, Ac011, Ac100, Ac110, and Ac111 for the address portion, respectively. In addition, registers 167, 168, 169, 170, 171, and 172 correspond to six amplitude reference values Dc000, Dc001, Dc011, Dc100, Dc110, and Dc111, respectively.

Output gates 111, 112, 113, 114, 115, 116, 117, 118, 119, 120, 121, and 122 that control the availability of output signals thereof are disposed downstream of the registers 161, 162, 163, 164, 165, 166, 167, 168, 169, 170, 171, and 172, respectively.

Clock pulses (not shown) are supplied to the 12 registers 161 to 172. Values stored in the registers 161 to 172 are supplied to a data/address selecting portion 105 corresponding to the clock pulses. In addition, the values stored in the registers 161 to 172 are supplied to the output gates 111 to 122.

The data/address selecting portion 105 outputs amplitude reference values for the data portion and the address portion as six amplitude reference values c000 to c111 corresponding to a MOGATE signal (that will be described later). Thus, c000 to c111 supplied to the BMC 132 are Dc000 to Dc111 or Ac000 to Ac111, respectively.

On the other hand, as will be described later, a selector 110 supplies an enable signal to the registers 161 to 172 and the output gates 111 to 122. The registers 161 to 172 store output data values of initial value selecting switches 161 to 172 corresponding to the enable signal. As will be described later, the initial value selecting switches 181 to 192 output an added value of an adding device 107 while the reproducing operation is being performed. The output gates 111 to 122 output stored values of the registers 161 to 172 to the next stage while the enable signal is active.

For example, an enable signal D000 is supplied to the register 161 and the output gate 111. In the period of the reproducing operation, while the enable signal D000 is active, the output gate 111 outputs the stored value of the register 161 to the next stage. In addition, the register 161 stores an added value of the adding device 107 through the initial value selecting switch 181.

Likewise, an enable signal D001 is supplied to the register 162 and the output gate 112. The output gate 112 outputs an amplitude reference value for the data portion stored in the register 162 corresponding to the enable signal D001. An enable signal D011 is supplied to the register 163 and the output gate 113. The output gate 113 outputs an amplitude reference value for the data portion stored in the register 163 corresponding to the enable signal D011. An enable signal D100 is supplied to the register 164 and the output gate 114. The output gate 114 outputs an amplitude reference value for the data portion stored in the register 164 corresponding to the enable signal D100. An enable signal D110 is supplied to the register 165 and the output gate 115. The output gate 115 outputs an amplitude reference value for the data portion stored in the register 165 corresponding to the enable signal D110. An enable signal D111 is supplied to the register 166 and the output gate 116. The output gate 116 outputs an amplitude reference value for the data portion stored in the register 166 corresponding to the enable signal D111.

An enable signal A000 is supplied to the register 167 and the output gate 117. The output gate 117 outputs an amplitude reference value for the address portion stored in the register 167 corresponding to the enable signal A000. An enable signal A001 is supplied to the register 168 and the output gate 118. The output gate 118 outputs an amplitude reference value for the address portion stored in the register 168 corresponding to the enable signal A001. An enable signal A011 is supplied to the register 169 and the output gate 119. The output gate 119 outputs an amplitude reference value for the address portion stored in the register 169 corresponding to the enable signal A011. An enable signal A100 is supplied to the register 170 and the output gate 120. The output gate 120 outputs an amplitude reference value for the address portion stored in the register 170 corresponding to the enable signal A100. An enable signal A110 is supplied to the register 171 and the output gate 121. The output gate 121 outputs an amplitude reference value for the address portion stored in the register 171 corresponding to the enable signal A110. An enable signal A111 is supplied to the register 172 and the output gate 122. The output gate 122 outputs an amplitude reference value for the address portion stored in the register 172 corresponding to the enable signal A111.

The output gates 111 to 122 output one value stored in the registers 161 to 172 corresponding to the enable signals to a multiplying device 106. The multiplying device 106 multiplies the stored value by $(1-\delta)$ and supplies the calculated value to the adding device 107.

On the other hand, a reproduced signal value that has been compensated for a delay time period by the shift register 100 is supplied to a multiplying device 108. The multiplying device 108 multiplies the supplied stored value by $\delta$ and supplies the calculated value to the adding device 107. The value of the correction coefficient $\delta$ used in the multiplying devices 106 and 108 is designated by for example the CPU 103.

The adding device 107 adds the calculated value of the multiplying device 106 and the calculated value of the multiplying device 108 and supplies the resultant value to the initial value selecting switches 181 to 192. As described above, the registers 161 to 172 store the added value corresponding to the enable signals D000 to D111 and A000 to A111, respectively. As will be described later, at any time point, only one of 12 enable signals becomes active. Thus, only one of the registers stores the added value.

The 12 enable signals are generated by the selector 110. The selector 110 receives a status data value sm[k+n] from the SMU 134. A register 109 delays the output data of the SMU 134 for the period of one clock pulse. The register 109 supplies a status data value sm[k+n−1] to the selector 110.

In addition, the MOGATE signal is supplied to the selector 110. While the data portion is being reproduced, the signal state of the MOGATE signal is active. The MOGATE signal is generated by for example a timing generator (not shown). The selector 110 references the matrix table (shown in FIG. 22) stored in a means such as an ROM and causes the signal state of one of the 12 enable signals D000 to D111 and A000 to A111 to be active.

By the structure and operation of the RAA 101, amplitude reference values for the data portion or address portion are updated corresponding to Formulas (52) and (53). Next, such an operation is described in the case that status data values are sm[k+n]="01" and sm[k+n−1]="11" and that these status data values are obtained from the data portion (namely, the signal state of the MOGATE signal is active). In other words, the updating operation of the amplitude reference value Dc011 corresponding to Formula (51) will be described.

From FIG. 22, it is clear that in such a case, the signal state of the enable signal D011 is active. This signal state causes the register 163 to store data and the output gate 173 to output the data. Consequently, the value of Dc011 that has not been updated (namely, the stored value of the register 163 at that point) is supplied to the multiplying device 106. The multiplying device 106 multiplies the supplied value by $(1-\delta)$. Thus, $(1-\delta) \times Dc\mathbf{011}$ in Formula (50) is calculated.

On the other hand, the reproduced signal value z[k] that has been compensated by the shift register 100 for a delay due to the operation of the SMU 134 is supplied to the multiplying device 108. The multiplying device 108 multiplies the supplied value by $\delta$. Thus, $\delta \times z[k]$ in Formula (51) is calculated.

The adding device 107 adds $(1-\delta) \times Dc\mathbf{011}$ calculated by the multiplying device 106 and $\delta \times z[k]$ calculated by the multiplying device 108. Thus, the new value of Dc011 (namely, the value of the right side of Formula (51)) is calculated. While the reproducing operation is being performed, the new value of Dc011 is supplied to the registers 161 to 172 through the initial value selecting switches 181 to 192.

As described above, since the signal state of only the enable signal D011 becomes active, the new value of c011 is stored to only the register 163. In such a manner, the value of Dc011 (namely, the stored value of the register 163) is updated.

When sm[k+n] and sm[k+n−1] are other values or when the signal state of the MOGATE signal is not active, since an enable signal whose signal state becomes active corresponding to FIG. 22 is selected, a register that stores a new value and an output gate that outputs the stored value of the register at that point (namely, the stored value that has not been updated) are selected. Thus, the stored value is updated.

Figure 23:
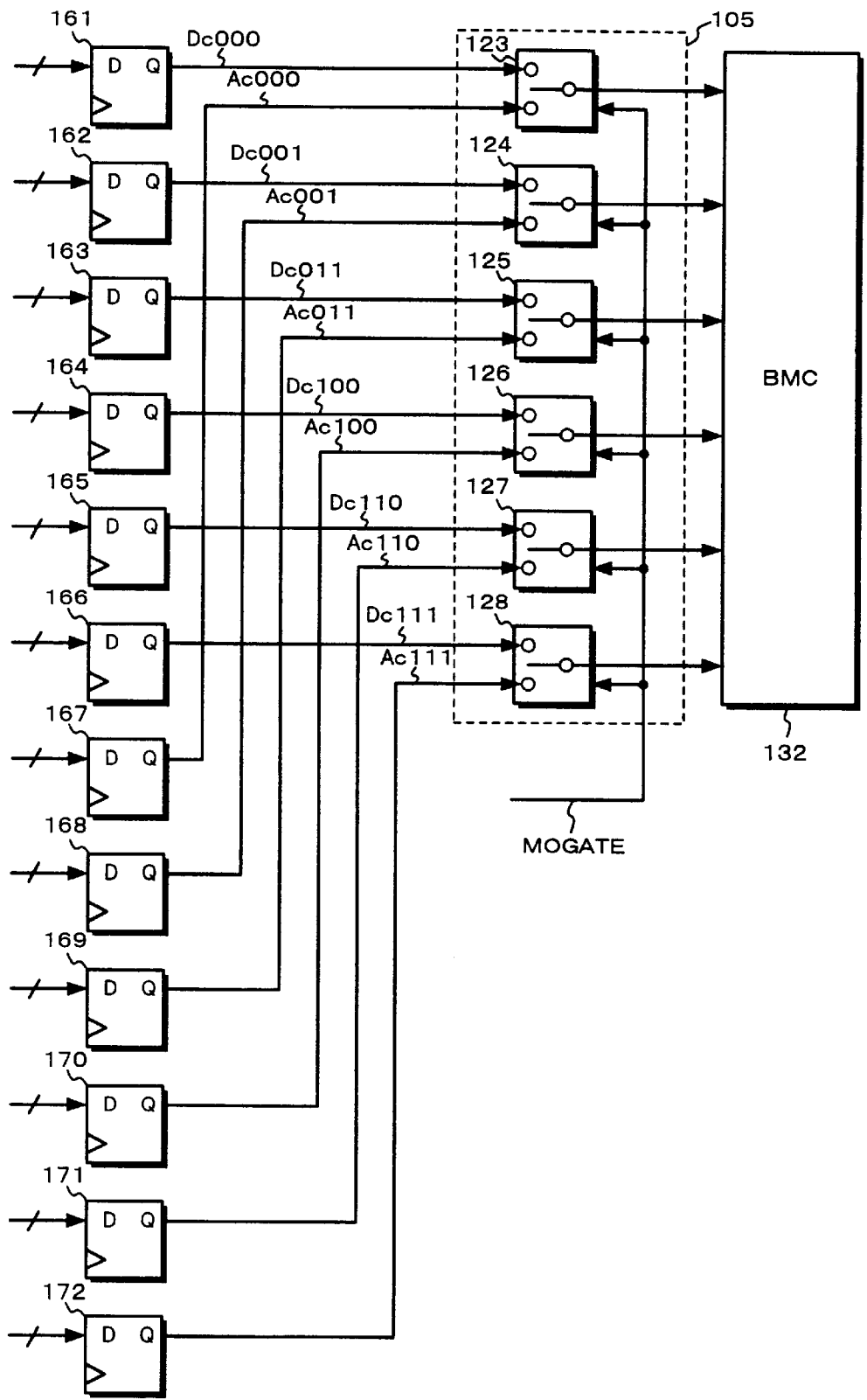
FIG. 23 is a block diagram for explaining the structure of a part of the amplitude reference value adapting block (RAA) shown in FIG. 21.

Next, with reference to FIG. 23, the data/address selecting portion 105 will be described. The data/address selecting portion 105 has six amplitude reference value selecting switches 123, 124, 125, 126, 127, and 128 corresponding to six amplitude reference values c000, c001, c011, c100, c110, and c111, respectively.

Stored values of the registers 162 to 172 as amplitude reference values for the data portion and the address portion are supplied to the amplitude reference value selecting switches 123, 124, 125, 126, 127, and 128. For example, a stored value Dc000 of the register 161 and a stored value Ac000 of the register 168 are supplied to the amplitude reference value selecting switch 123 corresponding to the amplitude reference value c000.

In addition, an MOGATE signal is supplied to each of the amplitude reference value selecting switches from a timing generator (not shown). When the signal state of the MOGATE signal is active, the amplitude reference value selecting switches selectively supply the amplitude reference values Dc000 to Dc111 for the data portion as c000 to c111 the BMC 132. On the other hand, when the signal state of the MOGATE signal is not active, the amplitude reference value selecting switches supply the amplitude reference values Ac000 to Ac111 for the address portion as c000 to c111 to the BMC 132.

The amplitude reference values are u dated and adapted corresponding to clock pulses when read gates become active and the Viterbi decoding process is started. As initial values of amplitude reference values for the adapting process, (a) predetermined values or (b) amplitude reference values at which the reproducing operation has been just performed are used.

In the method (a), the results of the adapted amplitude reference values at the time the reproducing operation has been just completed are not used. In this method, amplitude reference values that have been compensated are used. On the other hand, in the method (b), the results of the adapted amplitude reference values at the time the reproducing operation has been just completed are used.

As described above, according to the embodiment of the present invention, amplitude reference values for the address portion and amplitude reference values for the data portion are separately adapted. In this case, when the reproducing operation for a particular sector is started, amplitude reference values for the address portion and the data portion at the time the reproducing operation has been just completed are not used. Instead, predetermine values for each of the address portion and the data portion are used as initial values of amplitude reference values for each of the address portion and the data portion. On the other hand, in the method (b), amplitude reference values for each of the address portion and the data portion at the reproducing operation has been just completed are used.

When several sectors adjacently recorded on the magneto-optic disc 6 are successively reproduced, the decoding accuracy in the method (b) is occasionally superior to that in the method (a). The probability of which signals reproduced from adjacent sectors have similar characteristics is high. Thus, when a particular sector is reproduced, an amplitude reference value corresponding to the reproducing operation for an adjacent sector is used as an initial value. Thus, just after the particular sector is reproduced an amplitude reference value highly adapted to the characteristic of the reproduced signal can be used. Consequently, the decoding accuracy can be improved.

On the other hand, in the method (a) just after the reproducing operation is performed for a particular sector, since an amplitude reference value less adapted to the characteristic of the reproduced signal is used, especially, just after the reproducing operation is performed, the decoding accuracy may deteriorate.

When non-adjacent sectors are reproduced from the magneto-optic disc 6, the above-described tendency is present. Generally, unless a record medium is replaced, when initial values of amplitude reference values are designated in the method (b), the decoding accuracy may be improved.

However, due to a defect on the magneto-optic disc 6, an irregular signal may be reproduced from a particular sector. Corresponding to the irregular signal, an abnormal amplitude reference value may take place. In this case, in the reproducing operation that follows, the decoding accuracy in the case that initial values are designated in the method (a) is superior to that in the method (b).

In a rare case, the characteristics of reproduced signals largely vary sector by sector or in a particular sector. In this case, the designation of initial values corresponding to the method (a) is effective.

According to the embodiment of the present invention, the method (a) or (b) for designating initial values of amplitude reference values is selected with a command issued by the controller 2, the CPU 103, or the like when the reproducing operation is performed. When the reproducing operation is normally performed, initial values are designated corresponding to the method (b). On the other hand, when a sector with a defect is reproduced, if a correct reproduced result cannot be obtained and thereby a read-retry operation is performed, initial values are designated corresponding to the method (a).

Next, returning to FIG. 21, the structure of the RAA 101 that selects the method (a) or (b) for designating initial values of amplitude reference values will be described. The 12 registers 61, 62, 63, 64, 65, 66, 67, 68, 69, 70, 71, and 72 are disposed upstream of the amplitude reference value selecting switches 181, 182, 183, 184, 185, 186, 187, 188, 189, 190, 191, and 192, respectively. In the method (a), the registers 61, 62, 63, 64, 65, 66, 67, 68, 69, 70, 71, and 72 store particular values as initial values of Dc000, Dc001, Dc011, Dc100, Dc110, Dc111, Ac000, Ac001, Ac011, Ac100, Ac110, and Ac111. These particular values are designated by for example CPU 103.

For simplicity, in FIG. 21, clock pulses supplied to the 12 registers are omitted. Each register outputs the stored value corresponding to each clock pulse.

Thus, the stored values of the 12 registers 61 to 72 are supplied to the initial value selecting switches 181 to 192, respectively. On other hand, as described above, an output data value of the adding device 107 is supplied to the initial value selecting switches 181 to 192. In addition, for example, the CPU 103 supplies an initialization signal to the initial value selecting switches 181 to 192. Alternatively, the controller 2 may supply the initialization signal to the initial value selecting switches 181 to 192. The initial value selecting switches 181 to 192 selectively supply one of the stored values of the registers 61 to 72 and the output data value of the adding device 107 to the registers 161 to 172, respectively.

However, while the reproducing operation is being performed, the signal state of the initialization signal IN does not become active. Thus, as described above, while the reproducing operation is being performed, the initial value selecting switches 181 to 192 supply the output data value of the adding device 107 to the registers 161 to 172, respectively.

On the other hand, when the signal state of a relevant read gate becomes active and the reproducing operation for a particular sector is started, the CPU 103 or the like determines whether or not the signal state of the initialization signal IN is active. When the signal state of the initialization signal IN is active, the stored values of the registers 161 to 172 (namely, the amplitude reference values at the time the reproducing operation has been just completed) are used as initial values of the amplitude reference values for the relevant sector. In other words, the initial values of the amplitude reference values are designated corresponding to the method (b).

When the signal state of the initialization signal IN is active, the initial value selecting switches 181 to 192 supply the stored values of the registers 61 to 72 to the registers 161 to 172, respectively. In addition, for example the CPU 103 causes the signal states of the enable signals D000 to D111 and A000 to A111 to be active.

In such a manner, the stored values of the registers 61 to 72 are stored to the registers 161 to 172, respectively. Thus, the amplitude reference values at the time the reproducing operation has been just completed are not used. Instead, the predetermined values (namely, the stored values of the registers 61 to 72) are used as initial values of the amplitude reference values. In other words, the initial values of the amplitude reference values are designated corresponding to the method (a).

When the reproducing operation is performed for a sector with a defect, if a good reproduced result is not obtained and thereby a read-retry operation is performed, the signal state of the initialization signal IN becomes active. In this case, amplitude reference values at the time the reproducing operation has been just completed are amplitude reference values for the reproducing operation for a sector with a defect (in this case, the retry-operation is performed). These amplitude reference values may be abnormal values due to an irregular signal due to such a defect. Thus, when the read-retry operation is performed, the initial values of the amplitude reference values should be designated corresponding to the method (a).

According to the embodiment of the present invention, the availability of the adapting process for amplitude reference values is controlled corresponding to the process of the reproducing operation. As described above, corresponding to a signal generated by for example the CPU 103, the value of a correction coefficient δ of the multiplying devices 106 and 108 is controlled. When the value of the correction coefficient δ is designated to 0, in Formula (52) or (53), the relation of cpqr (new)=cpqr (old) is always satisfied. Thus, the amplitude reference values are not updated. Consequently, the amplitude reference values are not adapted.

The designation of δ=0 can be performed (by for example the CPU 103) as a part of the designation of the correction coefficient δ for improving the follow-up characteristic of a reproduced signal. Alternatively, the designation of δ=0 may be performed independent from the follow-up controlling operation.

When the adapting process for amplitude reference values is not required, the data/address selecting portion 105 may not supply amplitude reference values to the BMC 132. In this case, the operation of the BMC 132 does not relate to the adapting process for the amplitude reference values.

The adapting process for the amplitude reference values is not performed in the case that a sector that has not been correctly reproduced due to a defect is read-retried. In this case, if the amplitude reference values are adapted, abnormal amplitude reference values due to a defect may take place.

Figure 24:
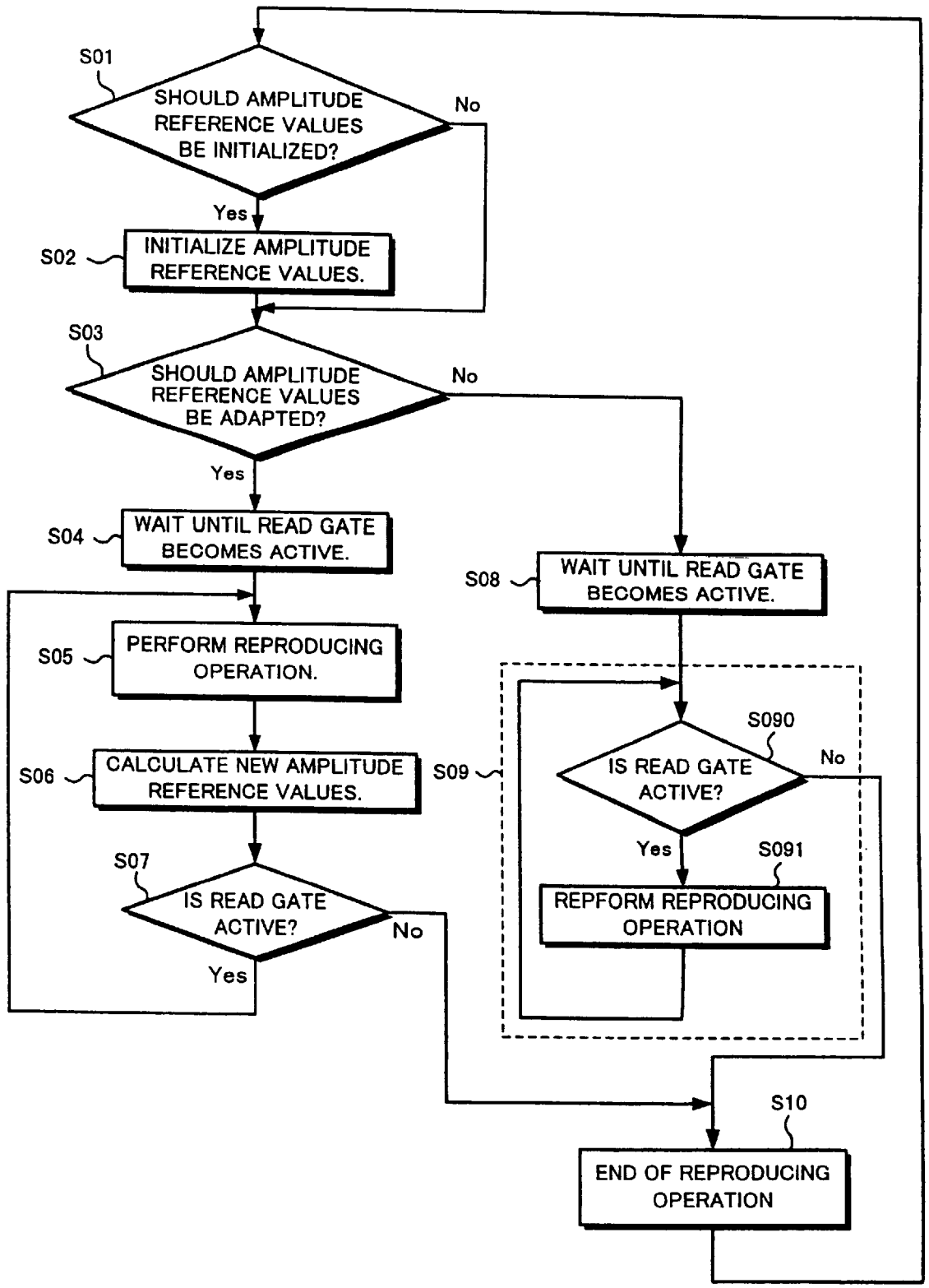
FIG. 24 is a flow chart for explaining an example of a process in a reproducing mode according to an embodiment of the present invention.

Next, with reference to a flow chart shown in FIG. 24, an example of the overall process performed in the reproducing mode will be described. At step S01, it is determined whether or not amplitude reference values should be initialized. When the amplitude reference values should be initialized (namely, the determined result at step S01 is Yes), the flow advances to step S02. After the amplitude reference values have been initialized, the flow advances to step S03. On the other hand, when the amplitude reference values should not be initialized (namely, the determined result at step S01 is No), the flow advances to step S03.

The case that the amplitude reference values should be initialized corresponds to the above-described method (a). In this case, the amplitude reference values at the time the reproducing operation has been just completed are not used. As initial values, predetermined values are used. In other words, at step S02, the predetermined values stored in the registers 61 to 72 are stored to the registers 161 to 166, respectively.

On the other hand, the case that the amplitude reference values should not been initialized corresponds to the above-described method (b). In this case, the stored values of the registers 161 to 172 at the time the reproducing operation has been just completed are used as initial values.

At step S03, it is determined whether or not amplitude reference values should be adapted. As described above, when the reproducing operation is normally performed, amplitude reference values are adapted. When the read-retry operation is performed, amplitude reference values are not adapted. When amplitude reference values should be adapted (namely, the determined result at step S03 is Yes), the flow advances to step S04. When the amplitude reference values should not been adapted (namely, the determined result at step S03 is No), the flow advances to step S08.

Next, the process after step S04 will be described. At step S04, no operation is performed until a read gate becomes active. After the read gate becomes active, the flow advances to step S05. At step S05, the reproducing operation is started.

After the reproducing operation is performed, the flow advances to step S06. At step S06, new amplitude reference values are calculated corresponding to clock pulses. Thus, the amplitude reference values are adapted.

At step S07, it is determined whether or not the read gate is active. When the read gate is active (namely, the determined result at step S07 is yes), the flow returns to step S05.

At step S05, the reproducing operation and the adapting process for the amplitude reference values are continued. When the read gate is not active (namely, the determined result at step S07 is No), the flow advances to step S10. At step S10, the reproducing operation is completed.

On the other hand, when the adapting process of the amplitude reference values should not be performed (namely, the determined result at step S03 is No), the flow advances to step S08. At step S08, no operation is performed until the read gate becomes active as with step S04. After the read gate becomes active, the flow advances to step S09. At step S09, the reproducing operation is performed without performing the adapting process for the amplitude reference values.

Step S09 has step S090 and step S091. At step S090, it is determined whether or not the read gate is active. When the read gate is active (namely, the determined result at step 090 is Yes), the flow advances to step S091. At step S091, the reproducing operation is performed. After the reproducing operation has been performed, the flow returns to step S090.

On the other hand, when the read gate is not active (namely the determined result at step S090 is No), the flow advances to step S10. At step S10, the reproducing operation is completed.

When the reproducing operation is completed at step S10, the flow returns to step S01.

According to the embodiment of the present invention, while the reproducing operation is being performed, the switches 181 to 192 always supply newly calculated values (namely, an output data value of the adding device 107) as amplitude reference values to the registers 161 to 172, respectively. On the other hand, even while the reproducing operation is being performed, when the output data value of the adding device 107 does not satisfy a predetermined criterion, the switches 181 to 192 may supply the stored values of the registers 61 to 72 to the registers 161 to 172, respectively. Thus, while the reproducing operation for one sector is being performed, even if abnormal amplitude reference values due to a defect of the record medium take place, the decoding accuracy can be prevented from deteriorating. However, in this case, it is necessary to disposed a structure that determines whether or not an output data value of the adding device 107 satisfies the particular criterion at predetermined interval corresponding to clock pulses.

The method for designating initial values of amplitude reference values may be selected for each of the address portion and the data portion. For example, the initial values of the amplitude reference values for the address portion may be designated corresponding to the above-described method (b). On the other hand, the initial values of the amplitude reference values for the data portion may be designated corresponding to the above-described method (a). Thus, when the read-retry operation is performed in the case that the reproducing operation is performed for a sector whose data portion has a defect, the initial values of the amplitude reference values can be designated in the following manner.

In the address portion, since the amplitude reference values have been properly adapted, the amplitude reference values at the time the reproducing operation has been just performed are used as initial values at the time the read-retry operation is performed. In the data portion, since the probability of which the amplitude reference values are abnormal values due to a defect is high, the amplitude reference values are initialized. In other words, amplitude reference values at the time the reproducing operation has been just completed are not used as initial values at the time the retry-operation is performed. Instead, predetermined values are used. Thus, the reproducing operation for the address portion as the retry-operation can be performed with amplitude reference values having high adaptivity.

Alternatively, the availability of the adapting process of the amplitude reference values can be selected for each of the address portion and the data portion. In this case, a signal for designating the value of δ of the multiplying devices 106 and 108 may be supplied corresponding to the MOGATE signal.

However, as described above, as the memory length of the four status memories is large, the probability of which the status data values VM00, VM11, VM01, and VM10 match becomes large. On the other hand, the delay time of the operation of the SMU increases. Thus, it is not practical to designate a too large memory length of the status memories.

Thus, when the signal quality of the reproduced RF signal deteriorates due to an improper operation condition of the reproducing system, the four status data values VM00, VM11, VM01, and VM10 may not match. To prevent such a situation, a structure that allows the most adequate status data value to be selected upon occurrences of mismatches of status data values may be disposed.

Such a structure may be disposed downstream of the four status memories. For example, the structure may be disposed downstream of the four status memories of the SMU 134. Alternatively, the structure may be disposed in the merge block 135 that generates decoded data corresponding to status data.

When it is not necessary to dispose such a structure in the SMU 134 because the signal quality of the reproduced signal is sufficiently high, as shown in FIG. 16, a status data value is supplied to the RAA 101 as an output data value of the SMU 134. On the other hand, as will be described later, when such a structure is disposed in the merge block 135, a value that is selected as the most adequate status data value is supplied to the RAA 101.

Figure 25:
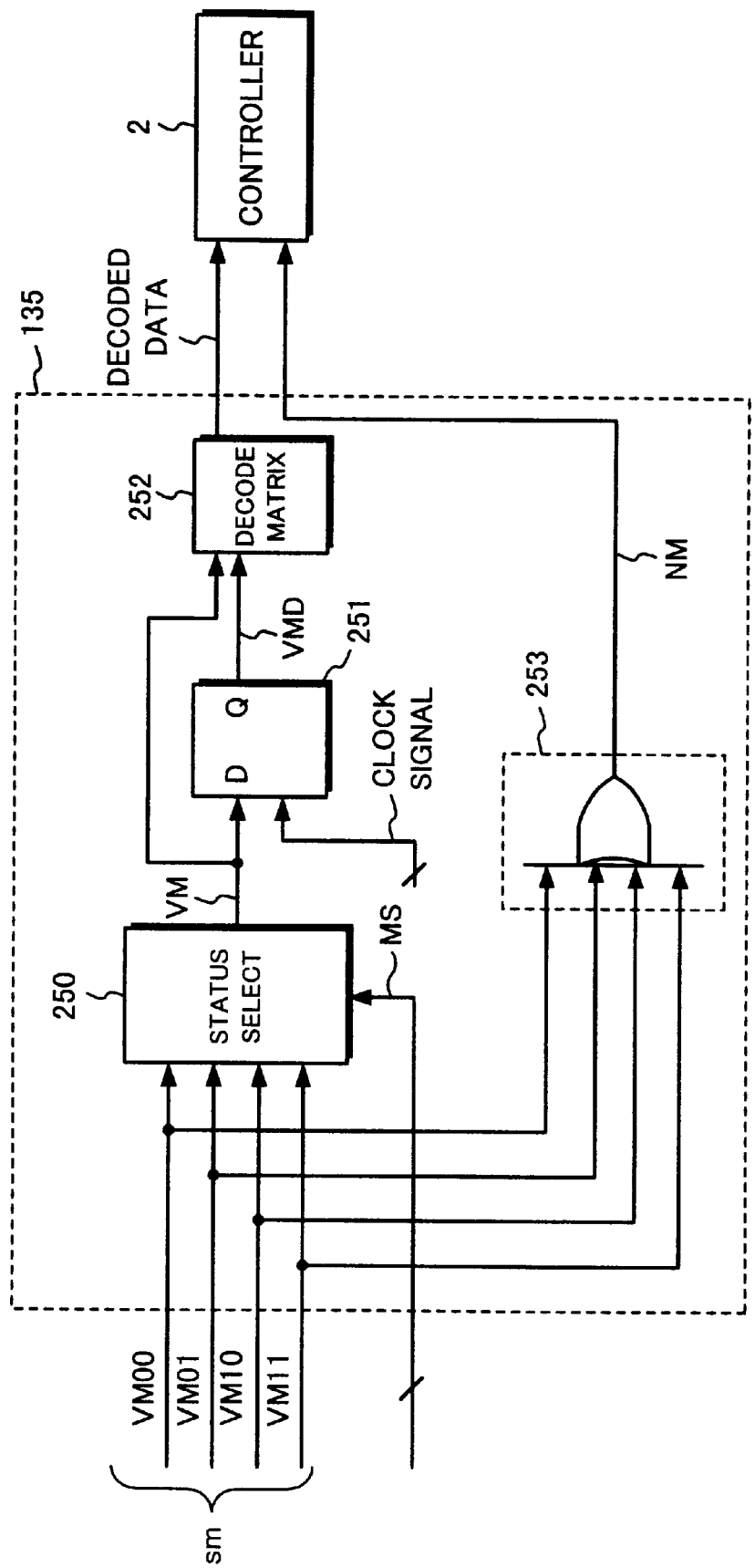
FIG. 25 is a block diagram for explaining an example of the structure of a merge block according to an embodiment of the present invention.

Next, with reference to FIG. 25, an example of the merge block 135 with such a structure will be described. Referring to FIG. 25, the merge block 135 comprises a status selecting circuit 250, a register 251, a decoding matrix portion 252, and an mismatch detecting circuit 253. The status selecting circuit 250 selects a proper one of VM0O, VM11, VM01, and VM10. The register 251 delays the output value of the status selecting circuit 250 by one clock period. The mismatch detecting circuit 253 detects a mismatch of the status data values VM00, VM11, VM01, and VM10.

The status selecting circuit 250 references a two-bit signal MS received from the ACS 133 corresponding to each clock pulse, selects the most adequate one of VM00, VM11, VM01, and VM10, and outputs the selected status data value as VM. The signal MS is a two-bit signal that represents which of values of path metrics to the statuses S0, S11, S01, and S10 is minimum. The signal MS is generated by for example the ACS 135. Thus, the probability of which the correct status data value is selected becomes high.

The status selecting circuit 250 supplies VM to the register 251 and the decoding matrix portion 252. The register 251 delays VM by one clock period and supplies the resultant data value to the decoding matrix portion 252. In the following description, the output data value of the register 251 is denoted by VMD. Thus, the decoding matrix portion 252 receives the status data value VM and the status data value VMD that has been delayed by one clock period. The decoding matrix portion 252 stores the decoding matrix table shown in FIG. 20 in a storing means such as a ROM.

The decoding matrix portion 252 references the decoding matrix table and outputs a decoded data value corresponding to VMD and VM.

On the other hand, the mismatch detecting circuit 253 can be structured with for example an exclusive-OR circuit. The status data values VM00, VM11, VM01, and VM10 are supplied to the mismatch detecting circuit 253. The mismatch detecting circuit 253 detects a mismatch of these four status data values and outputs the detected result as a mismatch detection signal NM. Unless all the four status data values match, the mismatch detection signal NM is enable or active.

The mismatch detection signal NM can be used for evaluating the quality of the decoded data and reproduced signal. Corresponding to the mismatch detection signal NM, the decoding means or the operation condition of the reproducing system can be controlled. As long as four status data values are supplied to the mismatch detecting circuit 253, the position thereof is not limited. Thus, it is not necessary to dispose the mismatch detecting circuit 253 in the merge block 135.

The merge block 135 handles the situation of which status data values mismatch because the signal quality of a reproduced signal is not good. Thus, when the signal quality of a reproduced signal is good and thereby the probability of which status data values mismatch is very low, it is not necessary to dispose the structure that handles the situation of a mismatch of status data values. In this case, the merge block 135 is composed of the register 251 and the decoding matrix portion 252.

When the merge block has the status selecting circuit 250, the output value VM of the status selecting circuit 250 is supplied as a status data value sm[k+n] at each time point to the RAA 101.

According to the embodiment of the present invention, amplitude reference values for the address portion and amplitude reference values for the data portion are separately adapted. The method for designating initial values of the amplitude reference values to be adapted and the availability of the adapting process for the amplitude reference values can be controlled. On the other hand, when amplitude reference values in common with the address portion and the data portion are used or when amplitude reference values corresponding to the type of the Viterbi decoding method are adapted, the method for designating the amplitude reference values as initial values and the availability of the adapting process for of the amplitude reference values can be controlled.

When amplitude reference values corresponding to the type of the Viterbi decoding method are adapted, the data portion is reproduced corresponding to the Viterbi decoding method, whereas the address portion is reproduced corresponding to non-Viterbi decoding method such as bit-by-bit decoding method.

The embodiment of the present invention is applied to a magneto-optic disc apparatus corresponding to six-value four-status Viterbi decoding method. However, it should be noted that the present invention is applied to magneto-optic disc apparatuses corresponding to other types of Viterbi decoding methods such as four-value four-status Viterbi decoding method, three-value four-status Viterbi decoding method, and seven-value six-status Viterbi decoding method.

In addition, the present invention can be applied to an information reproducing apparatus corresponding to Viterbi decoding method for decoding read data from data recorded on a record medium. In other words, the present invention can be also applied to rewritable discs (such as phase change type disc PD and CD-E (CD-Erasable)), recordable discs (such as CD-R), and read-only discs (such as CD-ROM).

It should be noted that the present invention is not limited to the above-described embodiment. Instead, without departing from the spirit of the present invention, various changes and modifications are available.

As described above, according to the present invention, the method for designating initial values of amplitude reference values adapted to reproduced signals corresponding to status transitions selected by a Viterbi decoder and the adapting process for the amplitude reference values are controlled corresponding to a reproduced result of such as a read-retry operation. In addition, according to the present invention, when the signal qualities of signals reproduced from two types of areas such as an address portion and a data portion on a record medium are different, amplitude reference values for the address portion and amplitude reference values for the data portion are separately adapted.

Since amplitude reference values for the address portion and amplitude reference values for the data portion are separately adapted, the accuracy of the Viterbi decoding process for signals reproduced from the address portion and the data portion can be improved.

The similar effects can be accomplished in the case that amplitude reference values are common in the address portion and the data portion when they have respective amplifiers and waveform equalizers. However, in this case, since two amplifiers and two waveform equalizers are required, the circuit scale and the power consumption increase. On the other hand, according to the present invention, the increase of the circuit scale can be suppressed.

When signals for a sector are correctly reproduced and amplitude reference values are properly adapted, amplitude reference values at the time the reproducing operation has been just completed are used as initial values of the adapting process for amplitude reference values for the next reproducing operation. Thus, Viterbi decoding process can be performed with amplitude reference values that adequately represent characteristics of reproduced signals.

On the other hand, when data cannot be correctly reproduced due to a defect on a record medium and thereby a process such as a read-retry process is performed, the probability of which abnormal branch metrics have been calculated due to irregular signals caused by the defect is high. However, according to the present invention, as initial values for an adapting process for amplitude reference values for the next reproducing operation, with predetermined values, the Viterbi decoding process can be properly performed.

In such a case, since the probability of which a sector to be read-retried has a defect is high, when amplitude reference values are adapted by the read-retry operation, the probability of which abnormal branch metrics take place due to irregular signals caused by a defect becomes high. However, according to the present invention, in such a case, since the availability of the adapting process for amplitude reference values is controlled, the Viterbi decoding process can be prevented from malfunctioning.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

What is claimed is:

1. An information reproducing apparatus for reproducing data on a recording medium corresponding to Viterbi decoding method, the data having been recorded with an RLL code, the apparatus comprising:

Viterbi decoding means for calculating a branch metric in each of a plurality of statuses with an input reproduced signal and an amplitude reference value and for selecting a maximum likelihood status transition with an added value of the calculated branch metric and a past path metric;

amplitude reference value adapting means for updating the amplitude reference value with the selected maximum likelihood status transition and the input reproduced signal corresponding to each of a plurality of clock pulses; and initial value setting means for setting an initial value of the amplitude reference value corresponding to a plurality of reproducing operations, wherein the recording medium has a plurality of types of areas, wherein said amplitude reference value adapting means updates the amplitude reference value corresponding to each of the areas, and wherein said amplitude reference value adapting means has:

amplitude reference value selecting means for recognizing the maximum likelihood status transition received from said Viterbi decoding means with a status data value and for selecting said amplitude reference value for an area from which said input reproduced signal is obtained corresponding to the recognized status transition;

mixing means for mixing the amplitude reference value selected by said amplitude reference value selecting means and the input reproduced signal at which the recognized status transition is selected in a predetermined ratio; and storing means for storing an output value of said mixing means.

2. The information reproducing apparatus as set forth in claim 1, wherein said initial value setting means has:

initial value storing means for storing an initial value of said amplitude reference value for each of said plurality of types of areas; and switching means for selectively outputting one of the initial value of the amplitude reference value stored in said initial value storing means and the output value of said mixing means.

3. The information reproducing apparatus as set forth in claim 1, further comprising:

controlling means for varying a mixing ratio of said mixing means so as to selectively update the amplitude reference value corresponding to each of the plurality of reproducing operations.

4. The information reproducing apparatus as set forth in claim 3, wherein said controlling means does not supply an output value of said amplitude reference value adapting means to said Viterbi decoding means when the amplitude reference value is not updated.

5. An information reproducing method of decoding a signal reproduced from a recording medium corresponding to Viterbi decoding method, data thereon having been recorded with an RLL code, wherein said recording medium has a plurality of areas including an address area and a recordable area each having different reproduced signal qualities, comprising the steps of:

calculating a branch metric in each of a plurality of statuses with an input reproduced signal and an amplitude reference value, and selecting a maximum likelihood status transition with an added value of the calculated branch metric and a past path metric;

updating the amplitude reference value, depending upon which of said plurality of areas said input reproduced signal is reproduced from, with the selected maximum likelihood status transition and the input reproduced signal corresponding to each of a plurality of clock pulses; and setting an initial value of the amplitude reference value corresponding to a plurality of reproducing operations.

6. The information reproducing method of claim 5, wherein said step of setting comprises selecting one of a predetermined initial value an a just-completed amplitude reference value with which a reproducing operation has been just completed.

7. The information reproducing method of claim 5, further comprising:

selectively updating the amplitude reference value corresponding to each of the plurality of reproducing operations.

8. The information reproducing method of claim 5, wherein the plurality of areas include said address area in which address information is formed as pits and said recordable area in which data is recorded, and wherein said step of setting sets said initial value for each of the address area and the recordable area as an area to be reproduced.

9. The information reproducing apparatus of claim 1, wherein said amplitude reference value adapting means has:

amplitude reference value selecting means for recognizing the maximum likelihood status transition received from said Viterbi decoding means with a status data value and for selecting said amplitude reference value for an area from which said input reproduced signal is obtained corresponding to the recognized status transition;

mixing means for mixing the amplitude reference value selected by said amplitude reference value selecting means and the input reproduced signal at which the recognized status transition is selected in a predetermined ratio; and storing means for storing an output value of said mixing means.

10. The information reproducing apparatus of claim 9, wherein said initial value setting means has:

initial value storing means for storing an initial value of said amplitude reference value for each of said plurality of types of areas; and switching means for selectively outputting one of the initial value of the amplitude reference value stored in said initial value storing means and the output value of said mixing means.

11. The information reproducing apparatus of claim 9, further comprising:

controlling means for varying a mixing ratio of said mixing means so as to selectively update the amplitude reference value corresponding to each of the plurality of reproducing operations.

12. The information reproducing apparatus of claim 11, wherein said controlling means does not supply an output value of said amplitude reference value adapting means to said Viterbi decoding means when the amplitude reference value is not updated.

13. An information reproducing method of reproducing data on a recording medium corresponding to Viterbi decoding method, the data having been recorded with an RLL code, comprising the steps of:

calculating a branch metric in each of a plurality of statuses with an input reproduced signal and an amplitude reference value and for selecting a maximum likelihood status transition with an added value of the calculated branch metric and a past path metric;

updating the amplitude reference value with the selected maximum likelihood status transition and the input reproduced signal corresponding to each of a plurality of clock pulses; and setting an initial value of the amplitude reference value corresponding to a plurality of reproducing operations, wherein the recording medium has a plurality of types of areas, wherein said step of updating updates the amplitude reference value corresponding to each of the areas, and wherein said step of updating comprises:

recognizing the maximum likelihood status transition received from said step of calculating with a status data value, and selecting said amplitude reference value for an area from which said input reproduced signal is obtained corresponding to the recognized status transition;

mixing the amplitude reference value selected by said step of recognizing and the input reproduced signal at which the recognized status transition is selected in a predetermined ratio; and storing an output value of said step of mixing.

14. The information reproducing method of claim 13, wherein said step of setting comprises:

storing an initial value of said amplitude reference value for each of said plurality of types of areas; and selectively outputting one of the initial value of the amplitude reference value stored in said step of storing said initial value and the output value of said step of mixing.

15. The information reproducing method of claim 13, further comprising:

varying a mixing ratio of said step of mixing so as to selectively update the amplitude reference value corresponding to each of the plurality of reproducing operations.

16. The information reproducing method of claim 15, wherein said step of varying does not supply an output value of said step of updating to said step of calculating and selecting when the amplitude reference value is not updated.

17. An information reproducing apparatus for reproducing data on a recording medium corresponding to Viterbi decoding method, the data having been recorded with an RLL code, the apparatus comprising:

a Viterbi decoder configured to calculate a branch metric in each of a plurality of statuses with an input reproduced signal and an amplitude reference value and to select a maximum likelihood status transition with an added value of the calculated branch metric and a past path metric;

an amplitude reference value adapting block configured to update the amplitude reference value with the selected maximum likelihood status transition and the input reproduced signal corresponding to each of a plurality of clock pulses; and a processor configured to set an initial value of the amplitude reference value corresponding to a plurality of reproducing operations, wherein the recording medium has a plurality of types of areas, wherein said processor is further configured to update the amplitude reference value corresponding to each of the areas, and wherein said processor has:
- amplitude reference value selecting means for recognizing the maximum likelihood status transition received from said Viterbi decoder with a status data value and for selecting said amplitude reference value for an area from which said input reproduced signal is obtained corresponding to the recognized status transition;
- mixing means for mixing the amplitude reference value selected by said amplitude reference value selecting means and the input reproduced signal at which the recognized status transition is selected in a predetermined ratio; and
- storing means for storing an output value of said mixing means.

18. The information reproducing apparatus as set forth in claim 17, wherein said processor has:
- initial value storing means for storing an initial value of said amplitude reference value for each of said plurality of types of areas; and
- switching means for selectively outputting one of the initial value of the amplitude reference value stored in said initial value storing means and the output value of said mixing means.

19. The information reproducing apparatus as set forth in claim 17, wherein:
- said processor is further configured to vary a mixing ratio of said mixing means so as to selectively update the amplitude reference value corresponding to each of the plurality of reproducing operations.

20. The information reproducing apparatus as set forth in claim 19,
wherein said processor is further configured to not supply an output value of said amplitude reference value adapting block to said Viterbi decoder when the amplitude reference value is not updated.

\* \* \* \* \*